US010989995B2

(12) United States Patent
Zhou et al.

(10) Patent No.: US 10,989,995 B2
(45) Date of Patent: Apr. 27, 2021

(54) LASER ASSEMBLY, LASER SOURCE AND LASER PROJECTION APPARATUS

(71) Applicant: Hisense Laser Display Co., Ltd., Shandong (CN)

(72) Inventors: Zinan Zhou, Shandong (CN); Youliang Tian, Shandong (CN); Wei Li, Shandong (CN)

(73) Assignee: HISENSE LASER DISPLAY CO., LTD., Qingdao (CN)

( * ) Notice: Subject to any disclaimer, the term of this patent is extended or adjusted under 35 U.S.C. 154(b) by 0 days.

(21) Appl. No.: 16/497,729

(22) PCT Filed: Sep. 19, 2019

(86) PCT No.: PCT/CN2019/106784
§ 371 (c)(1),
(2) Date: Sep. 25, 2019

(87) PCT Pub. No.: WO2020/134220
PCT Pub. Date: Jul. 2, 2020

(65) Prior Publication Data
US 2020/0341362 A1 Oct. 29, 2020

(30) Foreign Application Priority Data

Dec. 24, 2018 (CN) .......................... 201811583139.8
Mar. 19, 2019 (CN) .......................... 201910210132.X

(51) Int. Cl.
*G03B 21/20* (2006.01)
*G02B 19/00* (2006.01)
*G03B 21/28* (2006.01)

(52) U.S. Cl.
CPC ..... *G03B 21/2033* (2013.01); *G02B 19/0057* (2013.01); *G03B 21/28* (2013.01)

(58) Field of Classification Search
CPC .. G03B 21/28; G03B 21/142; G03B 21/2013; G03B 21/2033; G03B 21/2053;
(Continued)

(56) References Cited

U.S. PATENT DOCUMENTS 6,219,187 B1 4/2001 Hwu et al.
6,975,465 B1 12/2005 Chung et al.
(Continued)

FOREIGN PATENT DOCUMENTS

JP 2010045274 A 2/2010
JP 2014060452 A 4/2014
JP 2015099388 A 5/2015

OTHER PUBLICATIONS

International Search Report and Written Opinion dated Dec. 19, 2019 for corresponding application PCT/CN2019/106784 (Translation included).

*Primary Examiner* — Sultan Chowdhury
(74) *Attorney, Agent, or Firm* — Brinks Gilson & Lione

(57) ABSTRACT

The present disclosure describes a laser assembly. The laser assembly includes a support comprising at least one mounting groove. The laser assembly includes at least one laser mounted in the at least one mounting groove in a one-to-one correspondence. Each of the at least one laser includes a light emitting component configured to emit a light beam. A beam-shaping component is disposed at a light path of the light emitting component. The beam-shaping component includes a light incident surface disposed close to the light emitting component, the light incident surface is configured to transmit the light beam emitted from the light emitting component toward an opening of the mounting groove, and the light incident surface is configured to change a divergence angle of the light beam along at least one of a fast axis direction or a slow axis direction of the light beam.

20 Claims, 17 Drawing Sheets

(58) Field of Classification Search
CPC .......... G02B 19/0009; G02B 19/0028; G02B 19/0052; G02B 19/0056; G02B 19/0057; G02B 19/0066
See application file for complete search history.

(56) References Cited

U.S. PATENT DOCUMENTS

| | | | |
|---|---|---|---|
| 9,488,358 B2 * | 11/2016 | Hirose | G03B 21/16 |
| 2008/0084905 A1 | 4/2008 | Doerfel et al. | |
| 2009/0129420 A1 | 5/2009 | Regaard et al. | |
| 2016/0195236 A1 * | 7/2016 | Kita | F21V 5/007 353/52 |
| 2016/0273753 A1 * | 9/2016 | Inoue | G03B 21/2033 |
| 2017/0038505 A1 * | 2/2017 | Chern | H01S 5/4093 |
| 2018/0166851 A1 * | 6/2018 | Kijima | H01S 5/02212 |

* cited by examiner

US 10,989,995 B2

LASER ASSEMBLY, LASER SOURCE AND LASER PROJECTION APPARATUS

RELATED APPLICATIONS

This disclosure is a national phase entry under 35 USC 371 of International Patent Application No. PCT/CN2019/106784 filed on Sep. 19, 2019, which claims priority to Chinese Patent Application No. 201811583139.8, filed with the Chinese Patent Office on Dec. 24, 2018, and claims priority to Chinese Patent Application No. 201910210132.X, filed with the Chinese Patent Office on Mar. 19, 2019, which are incorporated herein by reference in their entireties.

TECHNICAL FIELD

The present disclosure relates to fields of laser projection technologies, and in particular, to a laser assembly, a laser source, and a laser projection apparatus.

BACKGROUND

A laser assembly may provide laser beams. The laser assembly is one of the important assemblies in a laser projection apparatus such as a laser television, a laser projector and the like.

SUMMARY

In one aspect, a laser assembly is provided. The laser assembly includes a support comprising at least one mounting groove, each of the at least one mounting groove comprises an opening. The laser assembly includes at least one laser mounted in the at least one mounting groove in a one-to-one correspondence. Each of the at least one laser includes a light emitting component configured to emit a light beam. A beam-shaping component is disposed at a light path of the light emitting component. The beam-shaping component includes a light incident surface. The light incident surface of the beam-shaping component is disposed close to the light emitting component, the light incident surface is configured to transmit the light beam emitted from the light emitting component toward the opening of the mounting groove, and the light incident surface is configured to change a divergence angle of the light beam along at least one of a fast axis direction or a slow axis direction of the light beam.

In another aspect, a laser source is provided. The laser source includes a laser assembly as described above, a main housing disposed at a light path of the laser assembly and fixedly connected to the laser assembly, and a light path assembly disposed in the main housing. The main housing comprising a light incident port, and the light incident port disposed at a light emitting path of the laser assembly.

In yet another aspect, a laser projection apparatus is provided. The laser projection apparatus includes a laser source as described above; an optical machine disposed at a light path of the light beam emitted from the laser source and configured to modulate the light beams emitted from the laser source to generate an image light beam and emit the image light beam; and a projection lens disposed at the light path of the light beams emitted from the laser source and configured to receive the image light beam and generate an image based on the image light beams.

BRIEF DESCRIPTION OF THE DRAWINGS

In order to describe technical solutions in embodiments of the present disclosure more clearly, the accompanying drawings used in the description of embodiments will be introduced briefly. Obviously, the accompanying drawings to be described below are merely some embodiments of the present disclosure, and a person of ordinary skill in the art may obtain other drawings according to these drawings.

DETAILED DESCRIPTION

Figure 1:
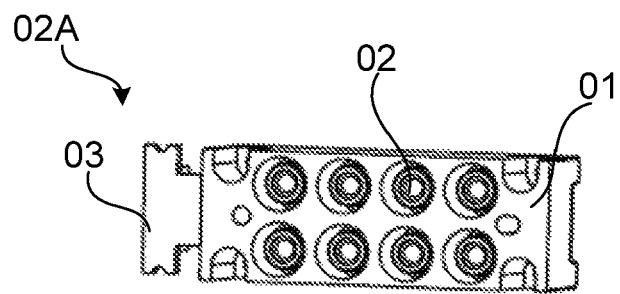
FIG. 1 is a schematic structural diagram of a laser assembly.

The technical solutions in some embodiments of the present disclosure will be described with reference to the accompanying drawings. Obviously, the described embodiments are merely some but not all embodiments of the present disclosure. All other embodiments obtained by those skilled in the art based on the embodiments of the present disclosure should be included in the protection scope of the present disclosure.

In the description of the embodiments of the present disclosure, it will be noted that the term "installation", "connected", or "attached" shall be understood broadly. For example, it may be a fixed connection, a detachable connection, or an integral connection; it may be directly connected, indirectly connected through an intermediate medium, or an internal communication between two elements. The specific meanings of the above terms in the present disclosure may be understood by those skilled in the art according to the specific situation.

Throughout the specification and claims, terms may have nuanced meanings suggested or implied in context beyond an explicitly stated meaning. Likewise, the phrase "in one embodiment" or "in some embodiments" as used herein does not necessarily refer to the same embodiment and the phrase "in another embodiment" or "in other embodiments" as used herein does not necessarily refer to a different embodiment. Similarly, the phrase "in one implementation" or "in some implementations" as used herein does not necessarily refer to the same embodiment and the phrase "in another implementation" or "in other implementations" as used herein does not necessarily refer to a different implementation. It is intended, for example, that claimed subject matter includes combinations of exemplary embodiments or implementations in whole or in part.

In general, terminology may be understood at least in part from usage in context. For example, terms, such as "and", "or", or "and/or", as used herein may include a variety of meanings that may depend at least in part upon the context in which such terms are used. Typically, "or" if used to associate a list, such as A, B or C, is intended to mean A, B, and C, here used in the inclusive sense, as well as A, B or C, here used in the exclusive sense. "And/or" if used to associate a list, such as "A and/or B", should be understood to mean only A, only B, or A and B. That is, "A and/or B" comprises three relationships. In addition, the term "one or more" or "at least one" as used herein, depending at least in part upon context, may be used to describe any feature, structure, or characteristic in a singular sense or may be used to describe combinations of features, structures or characteristics in a plural sense. Typically, "at least one" if used to associate a list, such as "at least one of A and B", should be understood to mean "only A, only B, or both A and B". Similarly, terms, such as "a", "an", or "the", again, may be understood to convey a singular usage or to convey a plural usage, depending at least in part upon context. In addition, the term "based on" or "determined by" may be understood as not necessarily intended to convey an exclusive set of factors and may, instead, allow for existence of additional factors not necessarily expressly described, again, depending at least in part on context.

The laser projection apparatus is a projection display apparatus that adopts a laser source as a display light source and cooperates with a projection display technology to image, such as a laser television, a laser projector, and the like. The laser source mainly includes a laser assembly and a light path assembly. The laser assembly is capable of emitting laser beams, and the laser assembly may be classified to a red laser assembly, a blue laser assembly, a green laser assembly and the like according to the color of the light emitted therefrom.

In one implementation, the laser source may include a plurality of laser assemblies with multiple colors. For example, one laser source may include a blue laser assembly and a red laser assembly. For another example, one laser source may include a blue laser assembly, a red laser assembly and a green laser assembly. The light path assembly may mix the light beam emitted from the laser assemblies with multiple colors. Moreover, in some examples, the light path assembly further includes a light homogenizing component such as a diffusion sheet. The light homogenizing assembly may adjust the uniformity of the mixed light beam to improve the effect of light homogenizing of the emitted light beams, thereby outputting illumination beams that satisfy imaging requirements.

In another implementation, the laser source may only include a laser assembly with one color (such as a blue laser assembly). The light path assembly may further include a color wheel. The color wheel may be excited by the laser emitted from the laser assembly to generate a variety of fluorescence with other colors. The light path assembly may mix the laser beam emitted from the laser assembly and the fluorescent beam generated by the excitation of the color wheel. In addition, the laser source may also include a light homogenizing component to adjust the uniformity of the mixed beam.

FIG. 1 shows a laser assembly. As shown in FIG. 1, the laser assembly 02A includes a support 01, a plurality of lasers 02, and a circuit board 03. Each laser 02 is electrically connected to the circuit board 03 and the circuit board 03 is fixed on the support 01, so that the plurality of lasers 02 are disposed in the same plane in an array and the light output directions of the plurality of lasers 02 are the same.

Figure 2:
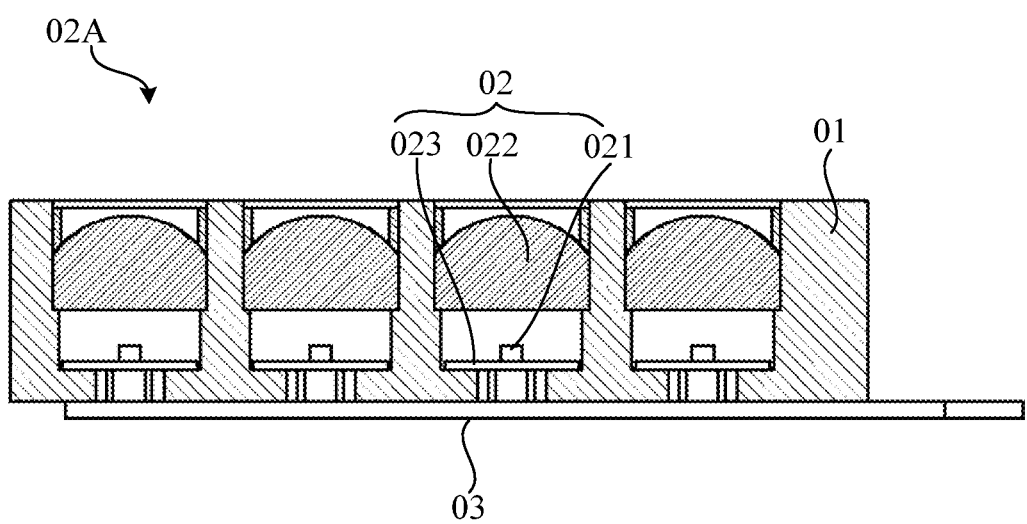
FIG. 2 is a cross-sectional view of the laser assembly shown in FIG. 1.

As shown in FIG. 2, each laser 02 includes a light emitting component 021, a collimating structure 022, and a substrate 023. The light emitting component 021 is disposed on the substrate 023, and the collimating structure 022 is located at a side of the light emitting component 021 away from the substrate 023. The collimating structure 022 may collimate the light beam emitted from the light emitting component 021.

Figure 3:
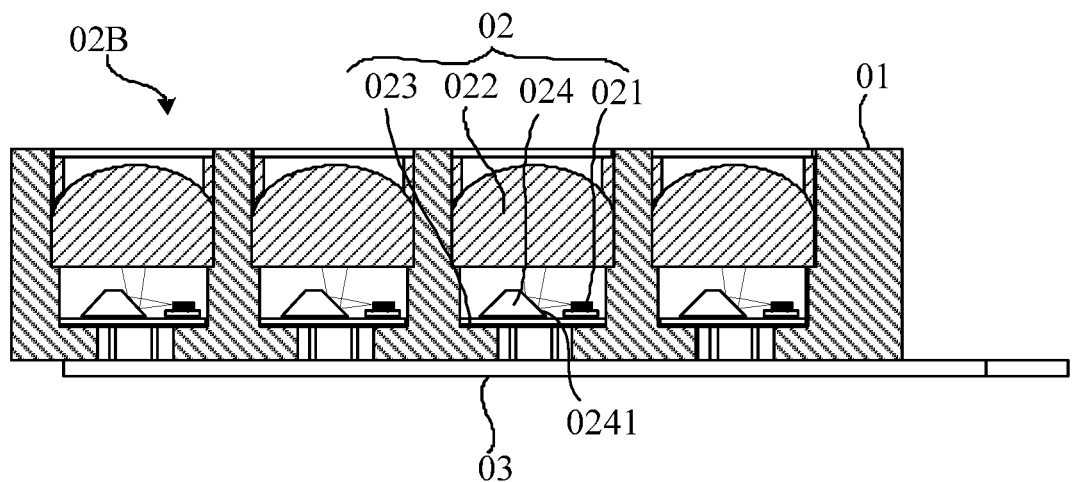
FIG. 3 is a schematic structural diagram of another laser assembly.

FIG. 3 shows another laser assembly. As shown in FIG. 3, the laser assembly 02B includes a support 01, a plurality of lasers 02, and a circuit board 03. Each laser 02 is electrically connected to the circuit board 03, and the circuit board 03 is fixed on the support 01, so that the plurality of lasers 02 are disposed in the same plane in an array and the light output directions of the plurality of lasers 02 are the same.

Herein, as shown in FIG. 3, each laser 02 includes a substrate 023, a light emitting component 021 disposed on the substrate 023, and a reflector 024 disposed on the substrate 023. Herein, a larger surface of all surfaces of the light emitting component 021 is mounted on the substrate 023 with stronger heat conduction and heat dissipation capability, so that heat generated by the light emitting component 021 may be better dissipated.

The light emitting component 021 emits light beams in a direction parallel to the substrate 023, and the reflector 024 is located on the light path of the light emitting component 021. The light beam emitted from the light emitting component 021 may be reflected by a reflecting surface 0241 of the reflector 024, so that the light beam emitted from the light emitting component 021 may emit toward a side of the light emitting component 021 away from the substrate 023. In addition, in the laser assembly 02B, the light beam emitted from the light emitting component 021 may also be collimated by the collimating structure 022 after being reflected by the reflector 024.

Figure 4:
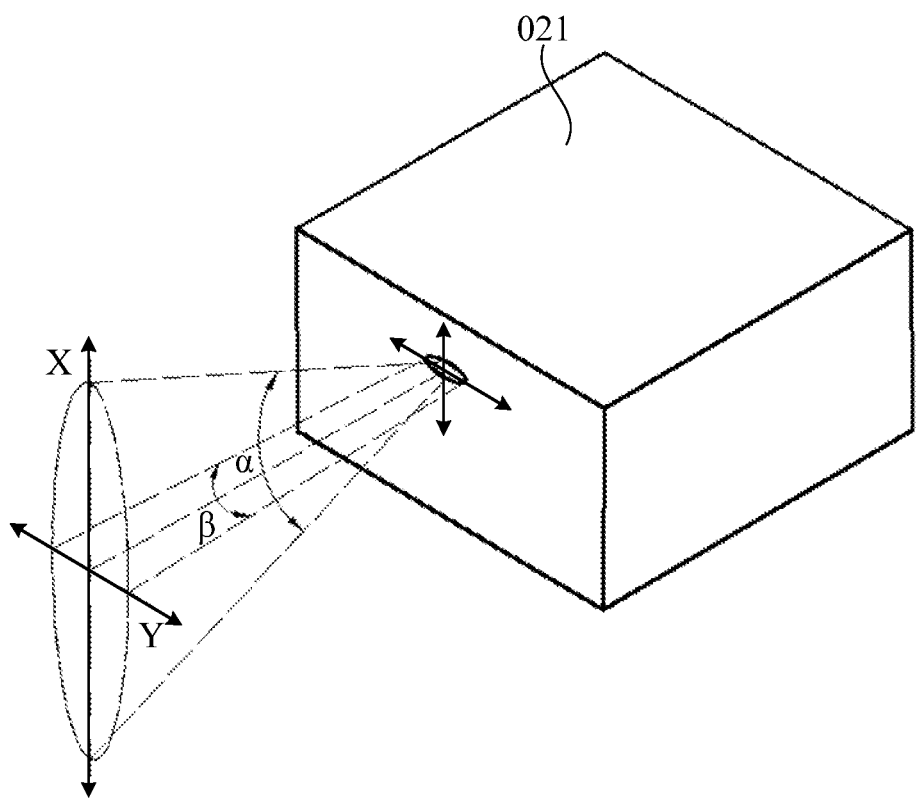
FIG. 4 is a schematic view of light paths of a light beam emitted from the light emitting component shown in FIG. 2 and FIG. 3 in the fast axis direction and the slow axis direction.

As shown in FIG. 4, the light emitted from the light emitting component 021 is divergent light along the fast axis direction (i.e. direction X in FIG. 4) and the slow axis direction (i.e. direction Y in FIG. 4 which is perpendicular to direction X) of the light beam. Moreover, the divergence angle α (usually 30° to 70°) along the fast axis direction is large, and a divergence angle β (usually 5° to 10°) along the slow axis direction is small. For example, in a case where the light emitting component 021 is a red light emitting component, the divergence angle α of the red light beam along the fast axis direction is greater than or equal to 68.2°, and the divergence angle β along the slow axis direction is only about 8°.

It should be noted that the cross-section of the light beam emitted from the light emitting component 021 is perpendicular to the optical axis of the light beam. For example, the cross-section is elliptical, and the intersection of the major axis and the minor axis of the ellipse intersects with the optical axis of the light beam. The fast axis direction X is a direction parallel to the major axis of the ellipse, and the slow axis direction Y is a direction parallel to the minor axis of the ellipse.

In a single laser 02, the light beam emitted from the light emitting component 021 has a larger width along the fast axis direction X and a smaller width along the slow axis direction Y when entering the collimating structure 022. Correspondingly, a light beam collimated by the collimating structure 022 has a larger width along the fast axis direction X and a smaller width along the slow axis direction Y. Therefore, in a case where the cross-section of the light beam output from a single laser 02 has a larger width along the fast axis direction X and a smaller width along the slow axis direction Y, the homogeneity of the light emitted from the entire laser assembly is poor. Moreover, since the maximum width of the cross-section of the light beam output from a single laser 02 is larger, the maximum width of the cross-section of the emitted light beam of the laser assembly 02A and the laser assembly 02B each including a plurality of lasers 02 is correspondingly increased, which results in that the size of at least part of the optical components (e.g., a light combining component such as a light combining mirror and a light homogenizing component such as a diffusion sheet) in the light path assembly located at the light path of the laser assembly needs to be designed to be larger to realize transmission of the light beam with a larger width of the cross-section. This will be detrimental to the subsequent miniaturized design of the light path assembly and the main housing containing the light path assembly.

Figure 5:
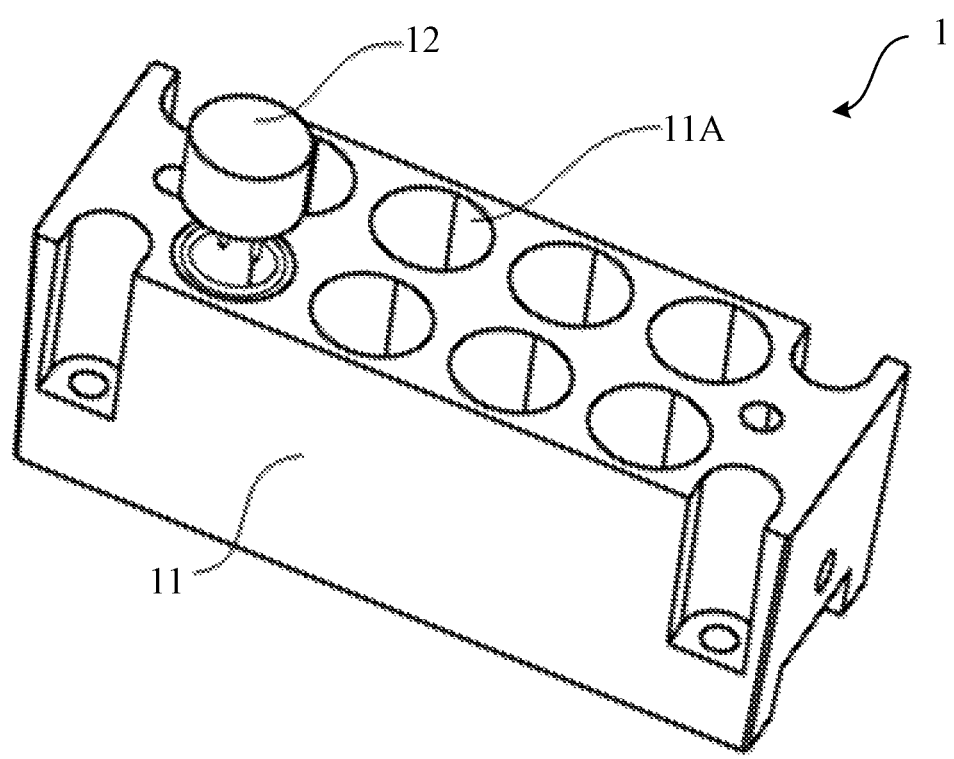
FIG. 5 is a schematic structural diagram of a laser assembly according to some embodiments of the present disclosure, where the light beams emitted from the light emitting component in the laser assembly are substantially perpendicular to a plane in which the light emitting component is located.
Figure 6:
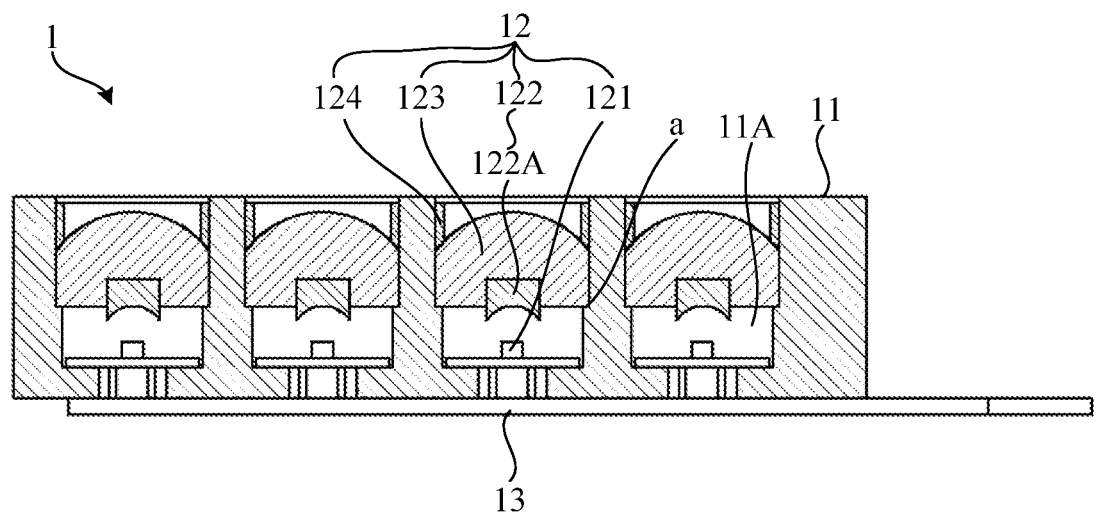
FIG. 6 is a schematic cross-sectional view of the laser assembly shown in FIG. 5.

Referring to FIG. 5 and FIG. 6, some embodiments of the present disclosure provide a laser assembly 1. The laser assembly 1 includes a support 11 and at least one laser 12. The support 11 is provided with at least one mounting groove 11A thereon, and the at least one laser 12 is mounted in the at least one mounting groove 11A in a one-to-one correspondence. In some embodiments, in order to provide light beams with sufficient brightness, the laser assembly 1 includes a plurality of lasers 12, and the support 11 is provided with a plurality of mounting grooves 11A thereon. Each laser 12 is mounted in the plurality of mounting grooves 11A on the support 11 in a one-to-one correspondence.

Each laser 12 includes a light emitting component 121 and a beam-shaping component 122. The light emitting component 121 is configured to emit light beams. The beam-shaping component 122 is disposed at the light path of the light emitting component 121, and the beam-shaping component 122 is configured to change the divergence angle of the light beam along at least one of the fast axis direction and the slow axis direction of the light beam. In this design, the maximum width of the cross-section of the light beam emitted from each laser 12 may be reduced by the beam-shaping component 122, and the cross-section is perpendicular to the optical axis of the light beam. Further, by reducing the maximum width of the cross-sectional of the light beam emitted from the entire laser assembly 1, at least part of the optical elements (for example, a light combining component such as a light combining mirror and a light homogenizing component such as a diffusion sheet) in the light path assembly located at the light path of the laser assembly 1 may be designed to be smaller in a case of ensuring normal transmission of the light beams emitted by the laser assembly 1. Thereby, the light path assembly and the laser source including the light path assembly and the laser assembly are advantageous to achieve a miniaturization design.

For example, a plurality of mounting grooves 11A provided on the support 11 are disposed in the same plane in an array. In this way, when the plurality of lasers 12 are respectively mounted in the plurality of mounting grooves 11A, the plurality of lasers 12 are also disposed in the same plane in an array, so that light emitting directions of the plurality of lasers 12 may be the same, and then the light beams emitted from the plurality of lasers 12 in the laser assembly 1 may be concentrated into an integrated emitting light beam. In some possible designs, as shown in FIG. 5, the support 11 is provided with eight mounting grooves 11A thereon, and each mounting groove 11A is mounted with a laser 12 therein.

In some embodiments, as shown in FIG. 6, the laser assembly 1 further includes a circuit board 13 fixed on the support 11. The light emitting component 121 of each laser 12 is electrically connected to the circuit board 13 to control the light emitting component 121 of each laser 12 to emit light beams by the circuit board 13.

The light emitting component 121 has various structural forms. For example, the light emitting component 121 is a light emitting chip separately arranged; or, the light emitting component 121 is a light emitting device packaged by a light emitting chip and a reflecting prism; or the light emitting component 121 is an assembly composed of a light emitting chip and a reflecting prism.

Colors of the light beams emitted from the light emitting component 121 are various. For example, the light emitting component 121 is a red light emitting component, a blue light emitting component, or a green light emitting component. In some examples, the light emitting component 121 is a red light emitting component. The divergence angle of the red light beam emitted from the red light emitting component along the fast axis direction is large, and the divergence angle may be 68.2° or more. The divergence angle of the red light beam emitted from the red light emitting component along the fast axis direction may be greatly reduced by the beam-shaping component 122, thereby achieving a purpose of reducing the maximum width of the cross-section of the output light beam, and the cross-section is perpendicular to the optical axis of the light beam.

Figure 7:
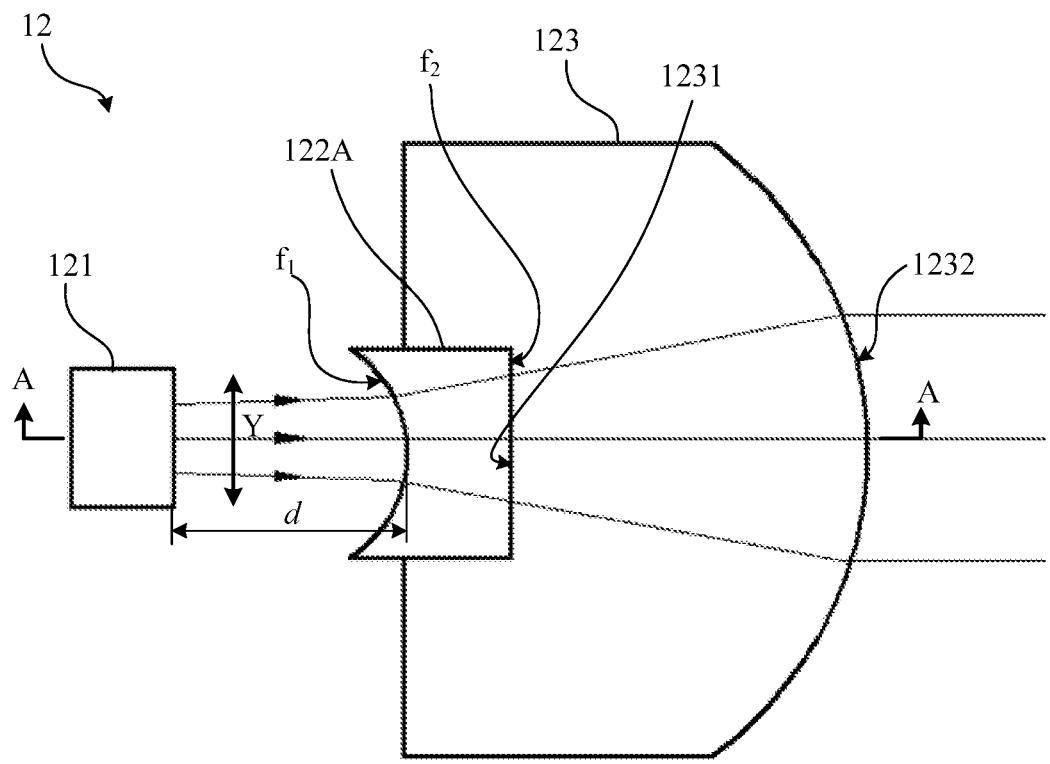
FIG. 7 is a schematic structural diagram of a single laser in the laser assembly shown in FIG. 6.
Figure 8:
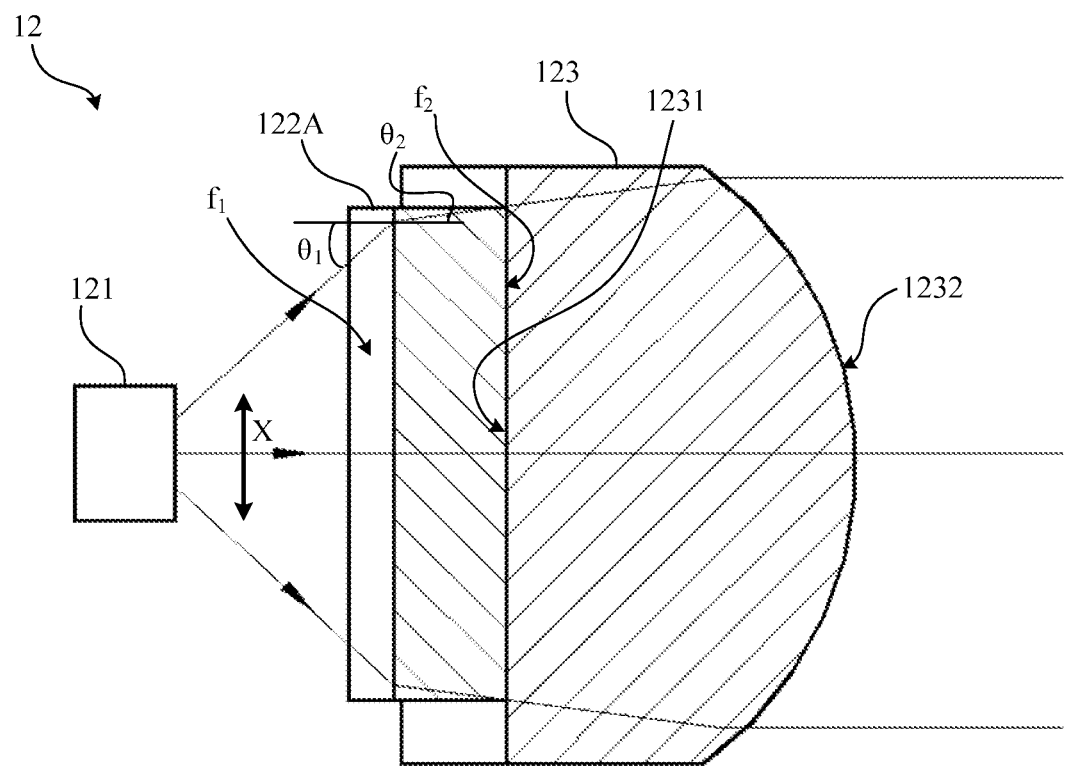
FIG. 8 is a cross-sectional view of the laser shown in FIG. 7 taken along the line A-A.

In some embodiments, as shown in FIG. 6-FIG. 8, the beam-shaping component 122 includes a beam-shaping lens 122A, and a light incident surface $f_1$ of the beam-shaping lens 122A is configured to transmit light beams emitted from the light emitting component 121.

For example, the light incident surface $f_1$ of the beam-shaping lens 122A is configured as reducing the divergence angle of the light beam along the fast axis direction X to reduce the width of the light beam along the fast axis direction X, and reducing the divergence angle of the light beam along the slow axis direction Y to reduce the width of the light beam along the slow axis direction Y. In this way, by reducing the cross-sectional width of the light beam output by the laser 12 in each direction, the cross-sectional width of the light beam emitted by the entire laser assembly 1 in each direction may be reduced, and at least part of the optical elements (for example, a light combining component such as a light combining mirror and a light homogenizing component such as a diffusion sheet) in the light path assembly located at the light path of the laser assembly 1 may be designed to be smaller in a case of ensuring normal transmission of the light beams emitted by the laser assembly 1. Thereby, the light path assembly and the laser source including the light path assembly and the laser assembly are advantageous to achieve a miniaturization design. In some examples, the light incident surface $f_1$ of the beam-shaping lens 122A may only be configured as reducing the divergence angle of the light beam along the fast axis direction X to reduce the width of the light beam in the fast axis direction X. In other examples, the light incident surface $f_1$ of the beam-shaping lens 122A may only be configured as reducing the divergence angle of the light beam along the slow axis direction Y to reduce the width of the light beam in the slow axis direction Y.

For example, referring to FIG. 7 and FIG. 8, the light incident surface $f_1$ of the beam-shaping lens 122A is configured as reducing the divergence angle of the light beam along the fast axis direction X to reduce the width of the light beam in the fast axis direction X, and increasing the divergence angle of the light beam along the slow axis direction Y to increase the width of the light beam in the slow axis direction Y. In this case, the cross-section of the light beam output by the laser 12 approaches a circle. The cross-sectional shape of the output light beam is more symmetrical, which is conducive to improve the homogeneity of light emitted by the laser assembly 1, so that the light path may be better homogenized when the laser assembly 1 is used in combination with a light homogenizing component (such as a diffusion sheet, and the like) of the light path assembly. In some examples, the light incident surface $f_1$ of the beam-shaping lens 122A may only be configured as increasing the divergence angle of the light beam in the slow axis direction Y to increase the width of the light beam in the slow axis direction Y.

For example, as shown in FIG. 7 and FIG. 8, the beam-shaping lens 122A is disposed at the light path of the light emitting component 121; a surface of the beam-shaping lens 122A close to the light emitting component 121 is the light incident surface $f_1$. The light incident surface $f_1$ is configured to transmit the light beams emitted from the light emitting component 121, so that the light beams are emitted toward the opening of the mounting groove 11A. In this design, the light beam emitted from the light emitting component 121 may enter into the beam-shaping lens 122A through the light incident surface $f_1$, and then shine to the opening of the mounting groove 11A from the light emitting surface $f_2$ of the beam-shaping lens 122A, so that the light beam emitted from the light emitting component 121 may emit from the opening of the mounting groove 11A, that is, the laser 12 may output light beams.

In some embodiments, referring to FIG. 7 and FIG. 8, the intersections of the light incident surface $f_1$ of the beam-shaping lens 122A and each plane perpendicular to the slow axis direction Y are a straight line to reduce the divergence angle of the light beam along the fast axis direction X. Moreover, the intersections of the light incident surface $f_1$ of the beam-shaping lens 122A and each plane perpendicular to the fast axis direction X are a concave curve to increase the divergence angle of the light beam along the slow axis direction Y. In this design, the beam-shaping lens 122A may reduce the divergence angle of the light beam along the fast axis direction X to reduce the width of the light beam in the fast axis direction X, and the beam-shaping lens 122A may increase the divergence angle of the light beam along the slow axis direction Y to increase the width of the light beam in the low axis direction Y. Thereby, the cross-section of the light beam output by the laser 12 approaches a circle. The cross-sectional shape of the output light beam is more symmetrical, which is conducive to improve the homogeneity of light emitted by the laser assembly 1. In some embodiments, the intersections of the light incident surface $f_1$ of the beam-shaping lens 122A and each plane perpendicular to the slow axis direction Y are a straight line to reduce the divergence angle of the light beam along the fast axis direction X. In some embodiments, the intersections of the light incident surface $f_1$ of the beam-shaping lens 122A and each plane perpendicular to the fast axis direction X are a concave curve to increase the divergence angle of the light beam along the slow axis direction Y.

For example, as shown in FIG. 7 and FIG. 8, the intersections of the light incident surface $f_1$ of the beam-shaping lens 122A and each plane perpendicular to the slow axis direction Y are a straight line, and each intersection is perpendicular to the optical axis of the light beams emitted from the light emitting component 121. In this design, in addition to light at the position of the optical axis, light diffused along the fast axis direction X in the light beams emitted from the light emitting component 121 is not vertically incident when reaching the light incident surface $f_1$ of the beam-shaping lens 122A, therefore, the light diffused along the fast axis direction X may be refracted by the beam-shaping lens 122A. According to the formula of the refraction law $n_1 \times \sin\theta_1 = n_2 \times \sin\theta_2$, herein, $n_1$ is a refractive index of the substance in the gap between the light emitting component 121 and the beam-shaping lens 122A, $\theta_1$ is an incident angle of light diffused along the fast axis direction X in the light beams emitted from the light emitting component 121 when entering the beam-shaping lens 122A, $n_2$ is a refractive index of the material of the beam-shaping lens 122A, and $\theta_2$ is a refraction angle of light diffused along the fast axis direction X in the light beams emitted from the light emitting component 121 after entering the beam-shaping lens 122A. In one implementation, a substance between the light emitting component 121 and the beam-shaping lens 122A may be air, therefore, $n_1$ equals to 1. $n_2$ may be greater than 1, so that $n_2$ is greater than $n_1$. Therefore, $\theta_2$ is less than $\theta_1$, and the beam-shaping lens 122A may reduce the divergence angle of light along the fast axis direction X in the light beams emitted from the light emitting component 121.

Moreover, in a case where the intersections of the light incident surface $f_1$ of the beam-shaping lens 122A and each plane perpendicular to the slow axis direction Y are a straight line, the design difficulty of the light incident surface $f_1$ of the beam-shaping lens 122A may be reduced, thereby reducing the complexity of the structure so that manufacturing the beam-shaping lens 122A may be easily achieved. In addition, it is convenient to determine a relative position between the light incident surface $f_1$ of the beam-shaping lens 122A and the light emitting component 121, and reduce the assembly difficulty of the laser 12.

According to the above described formula of the refraction law, as shown in FIG. 8, the larger $n_2$, the smaller the 82. The degree of decrease in the divergence angle of the light beam emitted from the light emitting component 121 in the fast axis direction X is larger, the width of the light beam output from the beam-shaping lens 122A in the fast axis direction X is smaller. However, the larger $n_2$, the higher the cost of the beam-shaping lens 122A, and the degree of attenuation of the light beam emitted from the light emitting component 121 after passing through the beam-shaping lens 122A is increased. Therefore, in some examples, the refractive index $n_2$ of the material of the beam-shaping lens 122 is 1.5 to 1.9, so that a beam-shaping effect of the beam-shaping lens 122A, the cost of the beam-shaping lens 122A, and an attenuation effect of the beam-shaping lens 122A on the light beam emitted from the light emitting component 121 may be taken into consideration at the same time. In some embodiments, $n_2$ may be a value of between 1.5 and 1.9, inclusive, for example but not limited to, 1.5, 1.6, 1.7, 1.8, 1.9, 1.55, 1.65, 1.75, 1.85, etc.

In some embodiments of the present disclosure, the intersections of the light incident surface $f_1$ of the beam-shaping lens 122A and each plane perpendicular to the slow axis direction Y are a convex curve. According to the principle of convergence of the light passing through a convex lens, the divergence angle of the light beam along the fast axis direction X may be reduced.

On this basis, for example, as shown in FIG. 7 and FIG. 8, the intersections of the light incident surface $f_1$ of the beam-shaping lens 122A and each plane perpendicular to the fast axis direction X are a concave curve. In this way, in a case where the light incident surface $f_1$ of the beam-shaping lens 122A reduces the divergence angle of the light beams emitted from the light emitting component 121 along the fast axis direction X, a divergence angle of the light beams emitted from the light emitting component 121 along the slow axis direction Y may be increased. It should be noted that, along an extending direction of the concave curve, the curvature of the concave curve may remain unchanged (i.e. the concave curve is a concave circular arc), or may be continuously changed (for example, curvature of the concave curve is sequentially 0.5, 0.8, 1.2 or the like). In some examples, the concave curve has a curvature value greater than 0 and less than 1. In this way, degree of curvature of each position on the concave curve is small, which is advantageous for reducing processing difficulty.

In some examples, as shown in FIG. 7, in the direction of the optical axis of the light beam emitted from the light emitting component 121, a distance d between the beam-shaping lens 122A and the light emitting component 121 is greater than 0 mm and less than or equal to 1.5 mm, for example, d is 0.5 mm, 0.8 mm or 1.5 mm. In this way, a gap between the beam-shaping lens 122A and the light emitting component 121 is small, which is advantageous for achieving a compact design of the laser assembly. For example, the distance d between the beam-shaping lens 122A and the light emitting component 121 is 0.56 mm in the direction of the optical axis of the light beam emitted from the light emitting component 121. In this way, the gap between the beam-shaping lens 122A and the light emitting component 121 is moderate, which is not only advantageous for the compact design of the laser assembly, but also prevents the gap between the beam-shaping lens 122A and the light emitting component 121 from being too small to increase the design difficulty of the light incident surface $f_1$ of the beam-shaping lens 122A.

In some embodiments, as shown in FIG. 7 and FIG. 8, each laser 12 further includes: a light collimating lens 123. The light collimating lens 123 is disposed at a side of the beam-shaping lens 122A away from the light emitting component 121, and a light emitting surface 1232 of the light collimating lens 123 is configured to collimate light beams adjusted by the beam-shaping lens 122A. In this design, the beam-shaping lens 122A may change the divergence angle of the light beam in at least one of the fast axis direction X and the slow axis direction Y before the light beam emitted from the light emitting component 121 entering the light collimating lens 123. The light beams, passed through the beam-shaping lens 122A and then through the light collimating lens 123, are substantially parallel.

For example, as shown in FIG. 7 and FIG. 8, the beam-shaping lens 122A may reduce the divergence angle of the light beams emitted from the light emitting component 121 along the fast axis direction X, thereby reducing the width of the light beams along the fast axis direction X after being collimated by the light collimating lens 123. In this way, a single laser 12 may achieve a purpose of reducing the width of the light beams emitted from the single laser along the fast axis direction by reducing the divergence angle of the light beams emitted from the light emitting component 121 along the fast axis direction X through the beam-shaping lens 122A, thereby reducing the maximum cross-sectional width of the light beam emitted by the laser assembly 1, so that the size of at least part of the optical components in the light path assembly at the light path of the laser assembly 1 may be reduced, to achieve a miniaturized design of volume of the light path assembly. Moreover, since the width of the light beam output by the laser 12 along the fast axis direction X is reduced, the cross-section of the light beam output by the laser 12 approaches a circle, so that the cross-sectional shape of the output beam of the laser 12 is more symmetrical. It is conducive to improving the homogeneity of light emitted by the laser component 1, so that a light homogenizing component may better homogenize the light path when the light homogenizing component is used in combination with the laser component 1 (such as a diffusion sheet, and the like) in the light path assembly.

In some embodiments, as shown in FIG. 7 and FIG. 8, the light emitting surface $f_2$ of the beam-shaping lens 122A is in contact with a light incident surface 1231 of the light collimating lens 123, and the material of the beam-shaping lens 122A and the material of the light collimating lens 123 are the same; or the beam-shaping lens 122A and the light collimating lens 123 are of an integral structure. In this way, by appropriately designing the light incident surface $f_1$ of the beam-shaping lens 122A, for example, the intersections of the light incident surface $f_1$ and each plane perpendicular to the slow axis direction Y are all designed to be a straight line, purpose of reducing the divergence angle of the light beam emitted from the light emitting component 121 along the fast axis direction X may be achieved. By appropriately designing the light emitting surface 1232 of the light collimating lens 123, for example, the light emitting surface 1232 is designed to be aspherical, and the light collimating lens 123 is an aspherical lens, a purpose of collimating the light beams emitted from the light emitting component 121 may be achieved. Therefore, design difficulty of the beam-shaping lens 122A and the light collimating lens 123 may be reduced, and the design and processing costs may be reduced.

In a case where the beam-shaping lens 122A and the light collimating lens 123 are of an integral structure, the number of components in the laser assembly may be reduced, and the assembly difficulty may be reduced.

In a case where the light emitting surface $f_2$ of the beam-shaping lens 122A is in contact with the light incident surface 1231 of the light collimating lens 123, and the material of the beam-shaping lens 122A is the same as the material of the light collimating lens 123, the light emitting surface $f_2$ of the beam-shaping lens 122A is adaptive to the light incident surface 1231 of the light collimating lens 123. For example, in a case where the light emitting surface $f_2$ of the beam-shaping lens 122A is a plane, the light incident surface 1231 of the light collimating lens 123 is also a plane; in a case where the light emitting surface $f_2$ of the beam-shaping lens 122A is a convex surface, the light incident surface 1231 of the light collimating lens 123 is a concave surface having the same curvature as the light emitting surface $f_2$ of the beam-shaping lens 122A. In some examples, as shown in FIG. 7 and FIG. 8, the light emitting surface $f_2$ of the beam-shaping lens 122A is contact with the light incident surface 1231 of the light collimating lens 123, and are both planes perpendicular to the optical axis of the light beams emitted from the light emitting component 121. In this way, structures of the beam-shaping lens 122A and the light collimating lens 123 are simple, which is advantageous for reducing a positioning difficulty among the beam-shaping lens 122A, the light collimating lens 123 and the light emitting component 121. In some examples, the light incident surface 1231 of the light collimating lens 123 is provided with a positioning groove, and a side where the light emitting surface $f_2$ of the beam-shaping lens 122A is located is embedded in the positioning groove.

The light emitting component 121, the beam-shaping lens 122A, and the light collimating lens 123 included in each laser 12 may be fixed on the support 11. The structure of the support 11 is various. The support 11 may support a plurality of lasers 12 and ensure a relative positional relationship among the light emitting component 121, the beam-shaping lens 122A and the light collimating lens 123 of each laser 12, which is not limited herein. For example, the structure of the support 11 and a connection mode between the support 11 and the laser 12 include, but are not limited to, the following three examples:

In example 1, as shown in FIG. 5 and FIG. 6, the support 11 is a block structure, and the mounting groove 11A is disposed on the support 11 at a position corresponding to each laser 12, the light emitting component 121 is fixed on a bottom wall of the corresponding mounting groove 11A, and the beam-shaping lens 122A and the light collimating lens 123 are fixed on side walls of the corresponding mounting grooves 11A. The support 11 has a simple structure and may accommodate the lasers 12 therein, thereby improving a protection effect on the lasers 12.

For example, the beam-shaping lens 122A is directly fixed on a side wall of the mounting groove 11A; or, as shown in FIG. 6, the beam-shaping lens 122A is fixed on the light collimating lens 123, and is fixed on the side wall of the mounting groove 11A by the light collimating lens 123. In some possible designs, the light collimating lens 123 is fixed on the side wall of the mounting groove 11A by bonding or clamping. In other possible designs, as shown in FIG. 6, the side wall of the mounting groove 11A is provided with a step surface a, and the light incident surface of the light collimating lens 123 bears against the step surface a. A tin ring 124 is disposed in the mounting groove 11A, and the tin ring 124 is located at the light path of the light collimating lens 123. By heating the tin ring 124, the tin ring 124 may be melted and fixed with the support 11, therefore, the light collimating lens 123 may be clamped between the step surface a and the tin ring 124.

Figure 9:
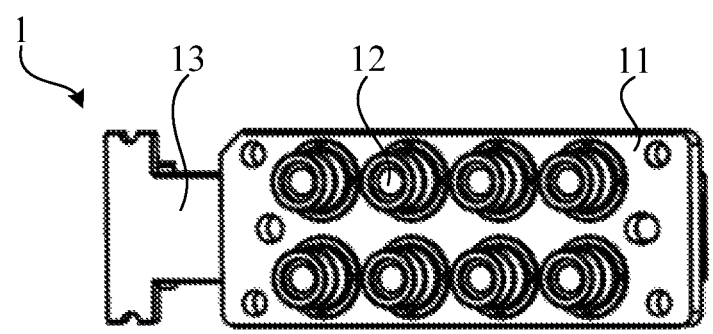
FIG. 9 is another schematic structural diagram of a laser assembly according to some embodiments of the present disclosure, where the light beams emitted from the light emitting component in the laser assembly are substantially perpendicular to the plane in which the light emitting component is located.
Figure 10:
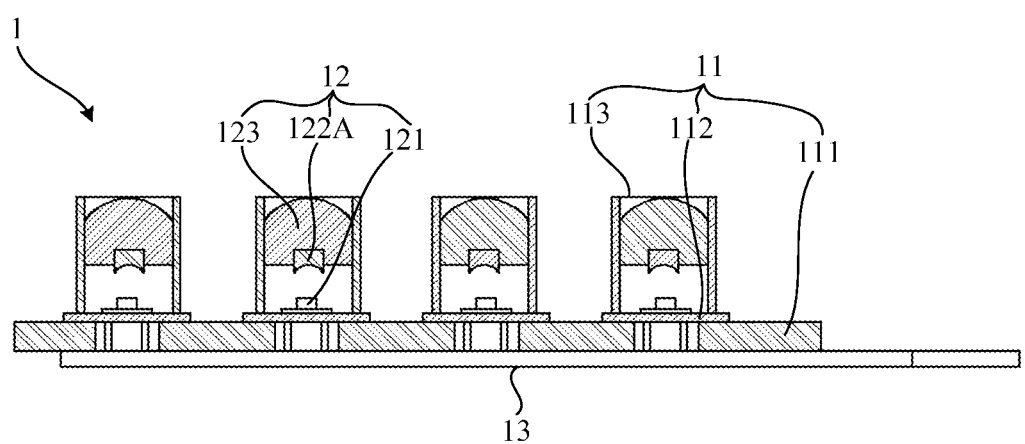
FIG. 10 is a schematic cross-sectional view of the laser assembly shown in FIG. 9.

In example 2, as shown in FIG. 9 and FIG. 10, the support 11 includes a support plate 111, a plurality of bottom plates 112, and a plurality of cylindrical shells 113. The plurality of bottom plates 112 are fixed on the support plate 111. Light emitting components 121 of the plurality of lasers 12 are fixed on the plurality of bottom plates 112 in a one-to-one correspondence. The plurality of cylindrical shells 113 are covered outside of the plurality of light emitting components 121 in a one-to-one correspondence, and the axial direction of each cylindrical shell 113 is parallel to the light emitting direction of the light emitting component 121 corresponding to the cylindrical shell 113, and the beam-shaping lenses 122A and the light collimating lenses 123 of the plurality of lasers 12 are fixed in the plurality of cylindrical shells 113 in a one-to-one correspondence. In this design, the support 11 is less in material and lighter in weight.

Figure 11:
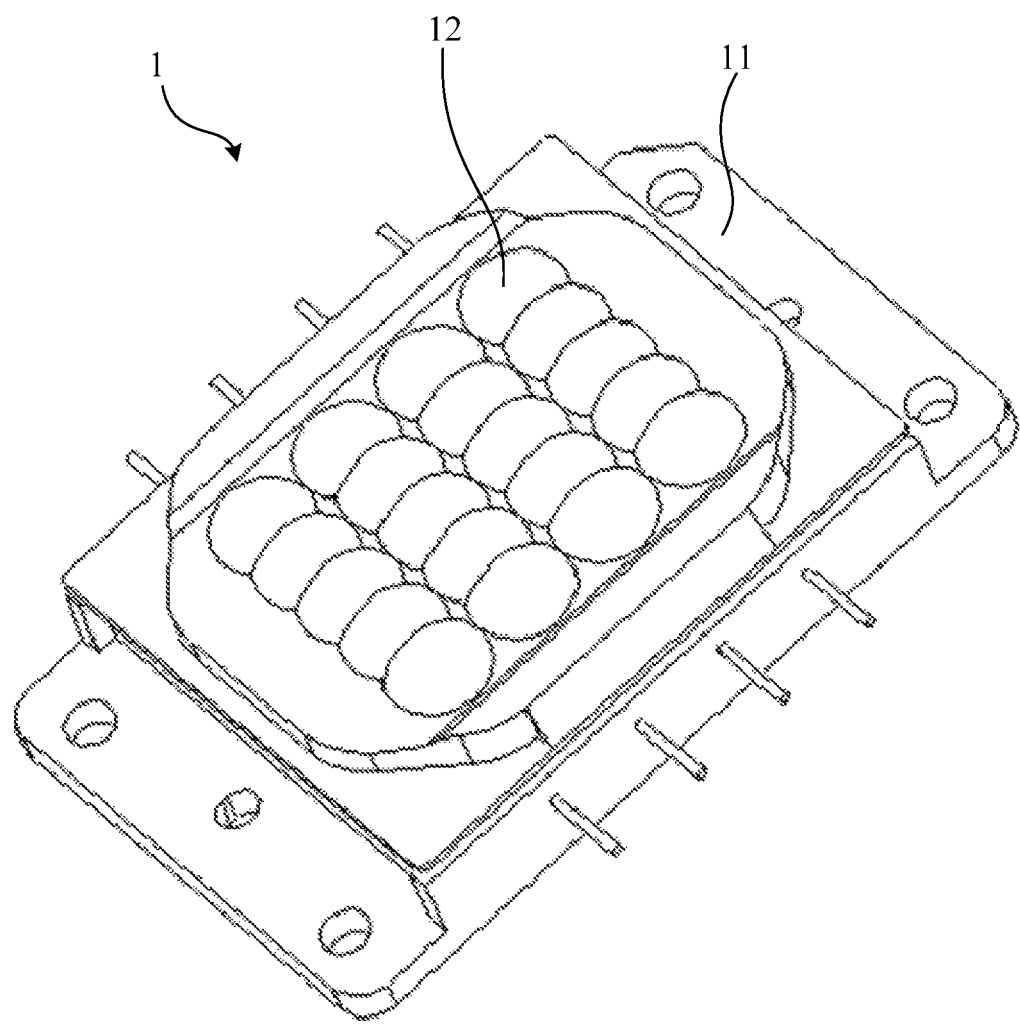
FIG. 11 is another schematic structural diagram of a laser assembly according to some embodiments of the present disclosure, where the light beams emitted from the light emitting component in the laser assembly are substantially perpendicular to the plane in which the light emitting component is located.
Figure 12:
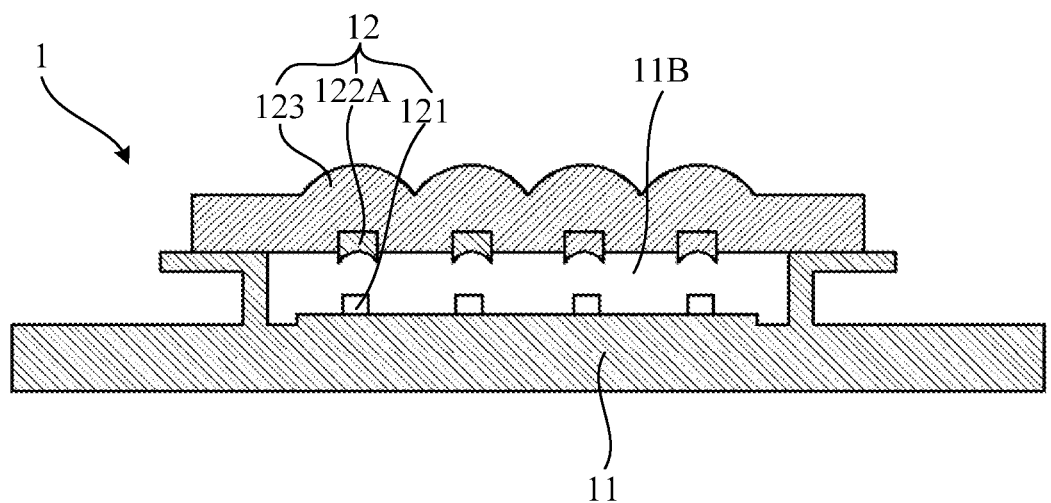
FIG. 12 is a schematic cross-sectional view of the laser assembly shown in FIG. 11.

In example 3, as shown in FIG. 11 and FIG. 12, the laser assembly 1 includes the support 11 and a plurality of lasers 12. The support 11 is a plate structure, and the support 11 is provided with a groove 11B thereon. The light emitting components 121 of the plurality of laser 12 are disposed on a bottom wall of the groove 11B. The beam-shaping lens 122A of each laser 12 is fixed on the light collimating lens 123, and the light collimating lenses 123 of the plurality of lasers 12 are integrated by an integral forming process. The integral structure covers an opening of the groove 11B, and the integral structure is fixed with the support 11. In this design, it is advantageous for reducing the space between any two adjacent lasers 12 in the laser assembly, and achieving a miniaturized design of volume of the laser assembly.

Figure 13:
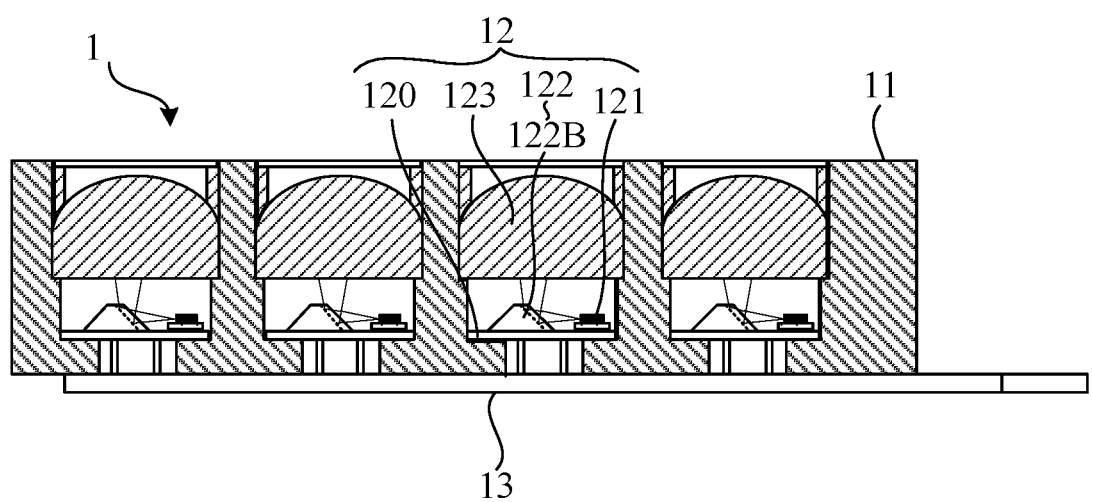
FIG. 13 is a schematic structural diagram of a laser assembly according to some embodiments of the present disclosure, where the light beams emitted from the light emitting component in the laser assembly are substantially parallel to the plane in which the light emitting component is located.
Figure 14:
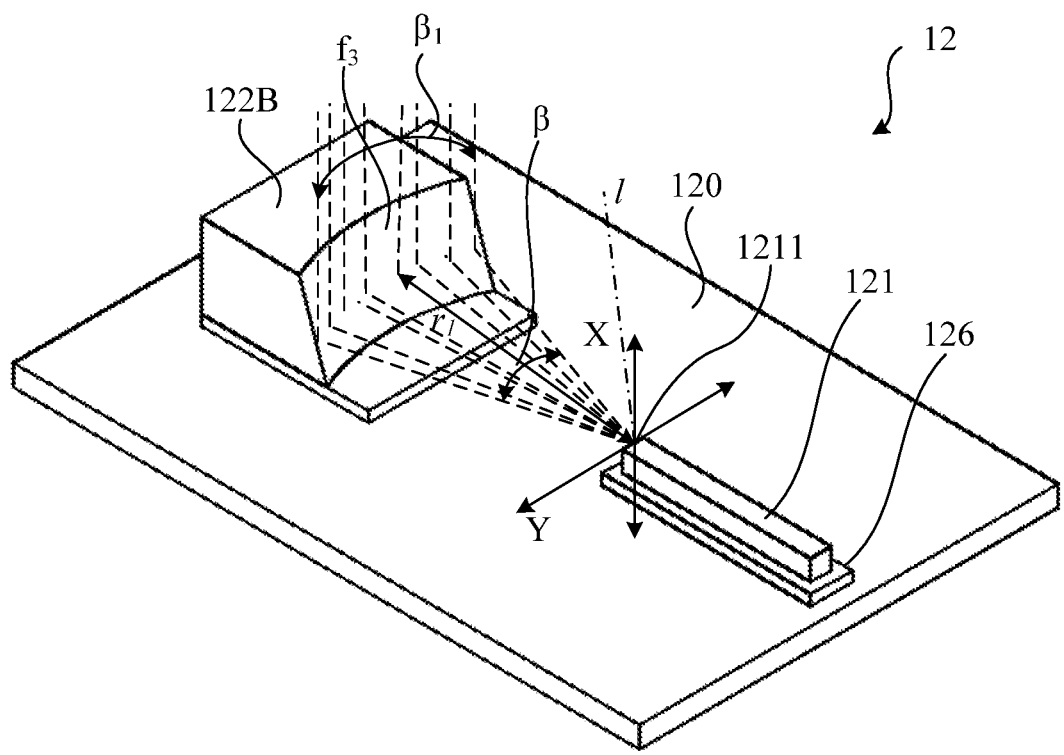
FIG. 14 is a schematic structural diagram of a single laser in the laser assembly shown in FIG. 13.

In other embodiments, as shown in FIG. 13 and FIG. 14, the beam-shaping component 122 includes a reflector 122B, and a light incident surface $f_3$ of the reflector 122B is configured to reflect the light beam emitted from the light emitting component 121.

For example, as shown in FIG. 13 and FIG. 14, each laser 12 further includes a substrate 120. The light emitting component 121 and the reflector 122B are both disposed on the substrate 120. The light emitting direction of the light emitting component 121 is parallel to the substrate 120. The reflector 122B is disposed at the light path of the light emitting component 121, that is, the reflector 122B is located at a light emitting path of the light emitting component 121. A surface of the reflector 122B close to the light emitting component 121 is a light incident surface $f_3$, and the light incident surface $f_3$ is configured to reflect the light beams emitted from the light emitting component 121 so that the light beams are emitted in a direction away from the substrate 120. Moreover, the light incident surface $f_3$ is configured to change the divergence angle of the light beam along at least one of the fast axis direction and the slow axis direction of the light beam.

In this design, the maximum width of the cross-section of the light beams emitted from each laser 12 may be reduced by the reflector 122B, and the cross-section is perpendicular to the optical axis of the light beam. Further, by reducing the maximum width of the cross-sectional of the light beam emitted by the entire laser assembly 1, at least part of the optical elements (for example, a light combining component such as a light combining mirror and a light homogenizing component such as a diffusion sheet) in the light path assembly located at the light path of the laser assembly 1 may be designed to be smaller in a case of ensuring normal transmission of the light beams emitted by the laser assembly 1. Thereby, the light path assembly and the laser source including the light path assembly and the laser assembly are advantageous to achieve a miniaturization design. Further, by appropriately setting the reflector 122B in the laser 12 shown in FIG. 13, the reflector 122B may also have a function of collimating light, thereby omitting the use of the collimating lens, which will be described later in detail.

Figure 15:
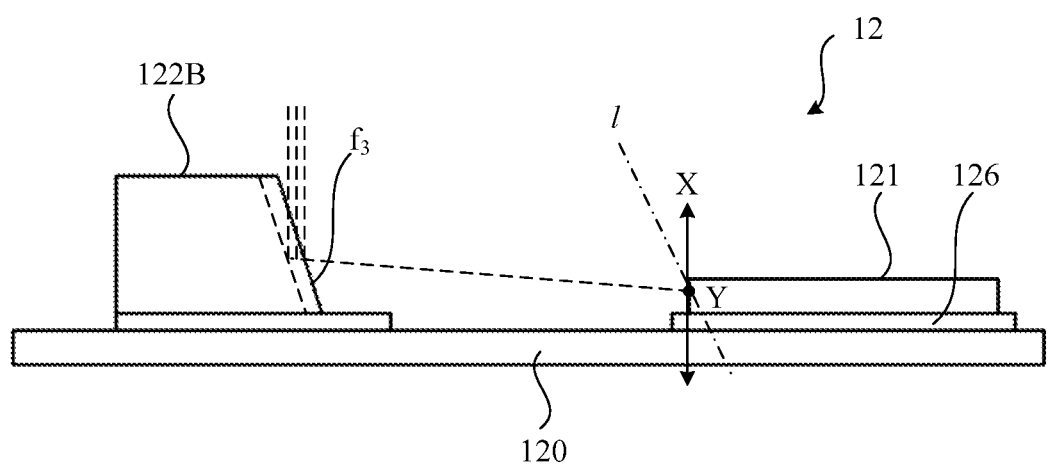
FIG. 15 is a front view of the laser shown in FIG. 14.

As some possible designs, as shown in FIG. 14 and FIG. 15, the light incident surface $f_3$ of the reflector 122B is a concave surface, and the intersections of the light incident surface $f_3$ and each plane perpendicular to one of the fast axis direction X and the slow axis direction Y are a concave curve. In this design, in a case where the light incident surface $f_3$ of the reflector 122B reflects the light beams emitted from the light emitting component 121 in the direction away from the substrate 120, it may reduce the divergence angle of the light beams emitted from the light emitting component 121 in the other of the fast axis direction X or the slow axis direction Y. For example, in a case where the intersections of the light incident surface $f_3$ and each plane perpendicular to the fast axis direction X are a concave curve, the divergence angle of the light beams emitted from the light emitting component 121 in the slow axis direction Y may be reduced. In a case where the intersections of the light incident surface $f_3$ and each plane perpendicular to the slow axis direction Y are a concave curve, the divergence angle of the light beams emitted from the light emitting component 121 in the fast axis direction X may be reduced. Therefore, in a case where the laser 12 having the reflector 122B is applied to a laser projection apparatus such as a laser television, a laser projector, and the like, a design size of the light path assembly located at the light path of the laser assembly may be reduced, which is advantageous for achieving a miniaturized design of the laser projection apparatuses.

On this basis, in some possible designs, as shown in FIG. 14 and FIG. 15, the intersections of the light incident surface $f_3$ of the reflector 122B and each plane perpendicular to the other direction of the fast axis direction X and the slow axis direction Y are a concave curve. In this way, the light incident surface $f_3$ may simultaneously reduce the divergence angle of the light beams emitted from the light emitting component 121 along the slow axis direction Y and the fast axis direction X. At this point, in the case where the laser 12 having the reflector 122B is applied to a laser projection apparatus such as a laser television, a laser projector, and the like, the size of the light path assembly located at the light path of the laser assembly may be designed to be smaller, which is advantageous for achieving a miniaturized design of the laser projection apparatus.

The shape of the light incident surface $f_3$ of the reflector 122B may be various, for example, two examples shown below:

In example 1, as shown in FIG. 14 and FIG. 15, the light incident surface $f_3$ of the reflector 122B is a concave surface, and the intersections of the light incident surface $f_3$ and each plane perpendicular to the fast axis direction X are a concave curve. In this way, in a case where the light incident surface $f_3$ reflects the light beams emitted from the light emitting component 121 in the direction away from the substrate 120, light diverging along the slow axis direction Y may be contracted, thereby reducing the divergence angle of the light beams emitted from the light emitting component 121 along the slow axis direction Y.

As shown in FIG. 14, the light incident surface $f_3$ of the reflector 122B may contract the divergence angle of the light beams emitted from the light emitting component 121 along the slow axis direction Y from β (usually 5° to 10°) to $β_1$, for example, $β_1$ is 0°, 1°, 2°, 3°, 4°, 5°, etc. It should be understood that the divergence angle $β_1$ after contraction is not limited herein.

The concave curve is a concave arc, a concave parabola or the like, which enables the light incident surface $f_3$ of the reflector 122B to contract the divergent light along the slow axis direction Y, thereby reducing the divergence angle of the light beams emitted from the light emitting component 121 along the slow axis direction Y. The curved shape of the concave curve is not limited herein.

On this basis, the intersections of the light incident surface $f_3$ of the reflector 122B and each plane perpendicular to the slow axis direction Y may be a straight line, curves or a concave curve.

In a case where the intersections of the light incident surface $f_3$ of the reflector 122B and each plane perpendicular to the slow axis direction Y are a straight line, as shown in FIG. 14 and FIG. 15, the incident surface $f_3$ of the reflector 122B is a flat cylindrical surface, and the reflector 122B has the advantages of being regular in structure and convenient to process.

Figure 16:
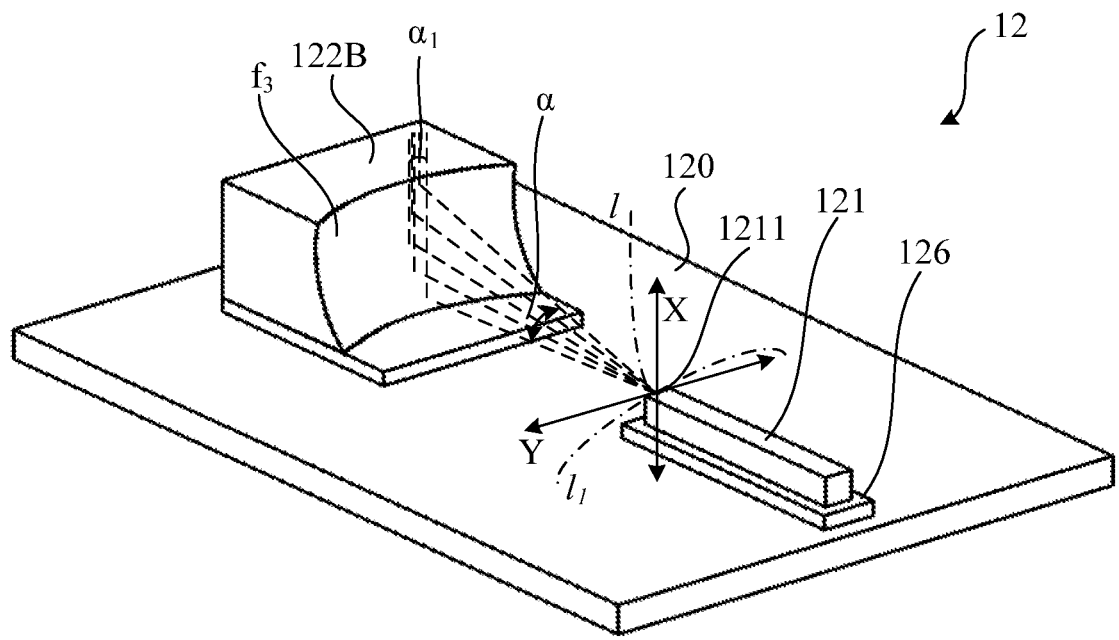
FIG. 16 is a schematic structural diagram of another single laser in the laser assembly shown in FIG. 13.
Figure 17:
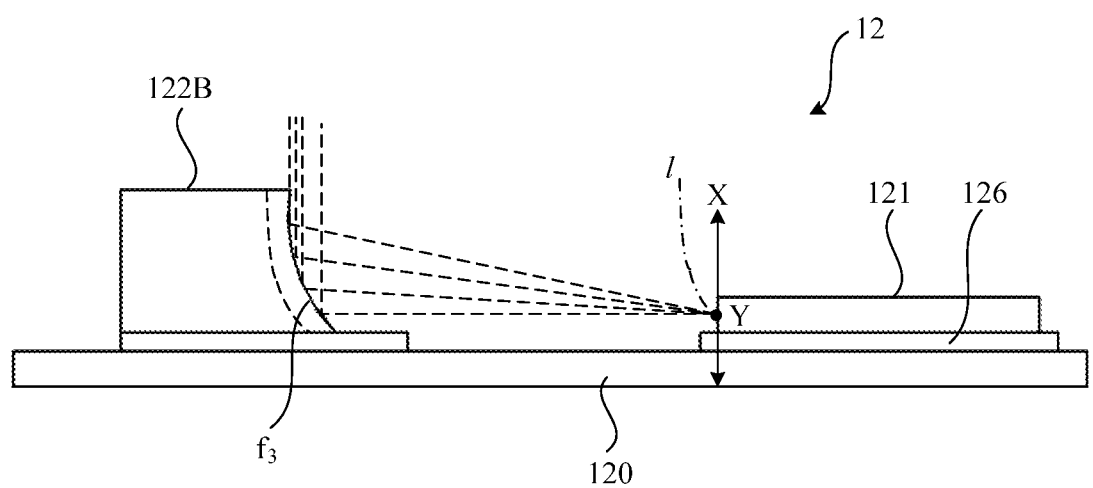
FIG. 17 is a front view of the laser shown in FIG. 16.

In a case where the intersections of the light incident surface $f_3$ of the reflector 122B and each plane perpendicular to the slow axis direction Y are a concave curve, as shown in FIG. 16 and FIG. 17, the light incident surface $f_3$ may contract the light emitted from the light emitting component 121 along the fast axis direction X, and also contract the light emitted from the light emitting component 121 along the slow axis direction Y, that is, the light incident surface $f_3$ may simultaneously reduce the divergence angle of the light beam emitted from the light emitting component 121 along the slow axis direction Y and the fast axis direction X. Therefore, in a case where the laser 12 having the reflector 122B is applied to a laser projection apparatus such as a laser television, a laser projector, and the like, a design size of the light path assembly located at the light path of the laser assembly may be reduced, which is advantageous for achieving a miniaturized design of the laser projection apparatus.

Referring to FIG. 16, the light incident surface $f_3$ of the reflector 122B may contract the divergence angle of the light beams emitted from the light emitting component 121 along the fast axis direction X from a (usually 30° to 70°) to $α_1$.

For example, $\alpha_1$ is 0°, 1°, 2°, 3°, 4°, 5°, 10°, etc. It should be understood that the divergence angle $\alpha_1$ after contraction is not limited herein.

Figure 18:
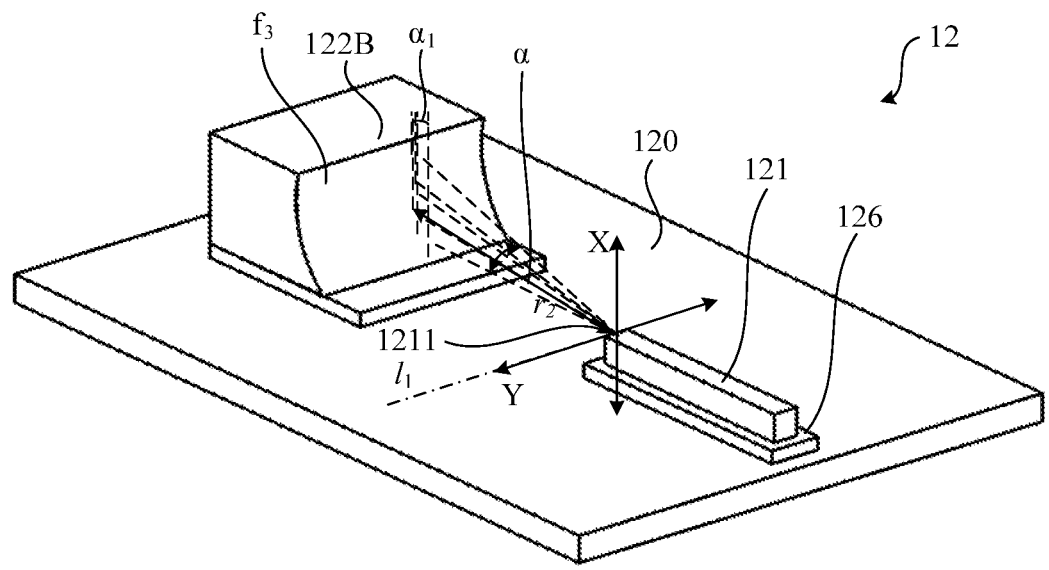
FIG. 18 is a schematic structural diagram of yet another single laser in the laser assembly shown in FIG. 13.
Figure 19:
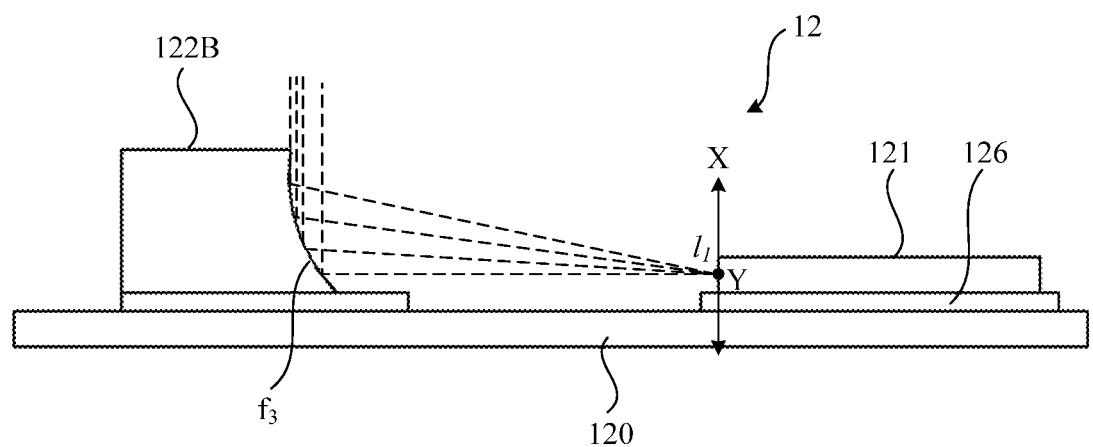
FIG. 19 is a front view of the laser shown in FIG. 18.

In example 2, as shown in FIG. 18 and FIG. 19, the light incident surface $f_3$ of the reflector 122B is a concave surface, and the intersections of the light incident surface $f_3$ and each plane perpendicular to the slow axis direction Y are all a concave curve. In this way, the reflecting surface 31 may contract the light emitted along the fast axis direction X while reflecting the light beams emitted from the light emitting component 121 in a direction away from the substrate 120, to reduce a divergence angle of the light emitted from the light emitting component 121 along the fast axis direction X.

As shown in FIG. 18, the light incident surface $f_3$ of the reflector 122B contract the divergence angle of the light emitting component 121 along the fast axis direction X from $a$ (usually 30° to 70°) to $\alpha_1$, for example, $\alpha_1$ is 0°, 1°, 2°, 3°, 4°, 5°, 10°, etc. It should be understood that the divergence angle $\alpha_1$ after contraction is not limited herein.

The concave curve is a concave arc, a concave parabola or the like, which enables the light incident surface $f_3$ of the reflector 122B to contract the divergent light along the fast axis direction X, thereby reducing the divergence angle of the light beams emitted from the light emitting component 121 along the fast axis direction X. The curved shape of the concave curve is not limited herein.

On this basis, the intersections of the light incident surface $f_3$ of the reflector 122B and each plane perpendicular to the fast axis direction X may be a straight line, a curve, a concave curve or the like.

In a case where the intersections of the light incident surface $f_3$ of the reflector 122B and each plane perpendicular to the fast axis direction X are a straight line, as shown in FIG. 18 and FIG. 19, the incident surface $f_3$ of the reflector 122 is a flat cylindrical surface, and the reflector 122B has the advantages of being regular in structure and convenient to process.

Figure 20:
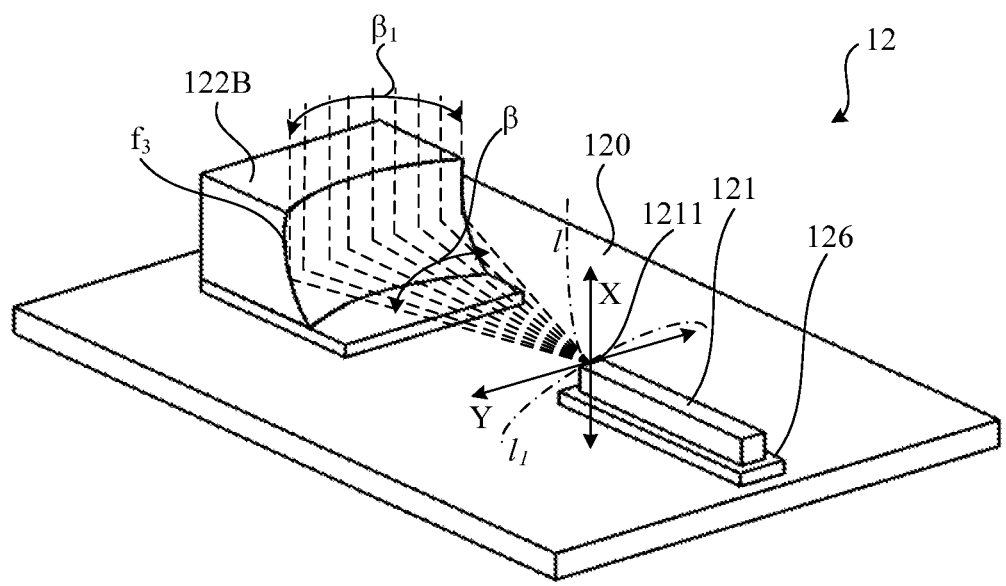
FIG. 20 is a schematic structural diagram of yet another single laser in the laser assembly shown in FIG. 13.
Figure 21:
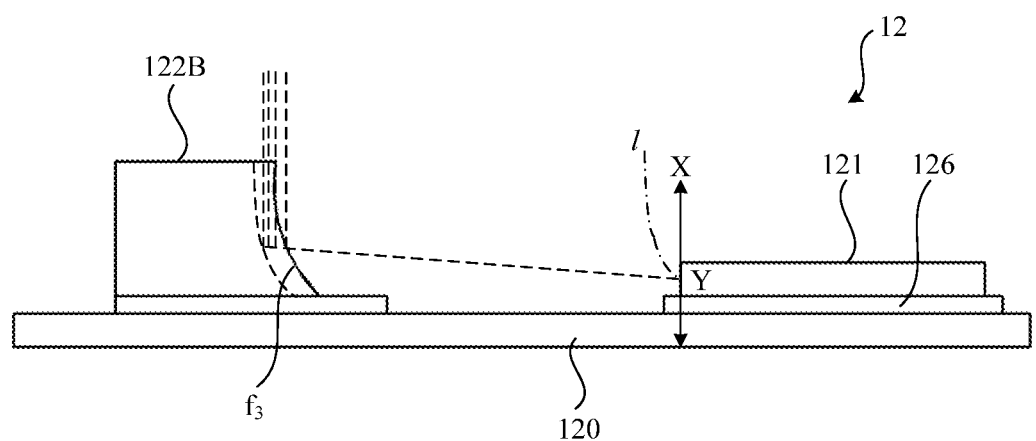
FIG. 21 is a front view of the laser shown in FIG. 20.

In a case where the intersections of the light incident surface $f_3$ of the reflector 122B and each plane perpendicular to the fast axis direction X are a concave curve, as shown in FIG. 20 and FIG. 21, the light incident surface $f_3$ may contract the light beams emitted from the light emitting component 121 along the slow axis direction Y, and also contract the light beams emitted from the light emitting component 121 along the fast axis direction X, that is, the light incident surface $f_3$ may simultaneously reduce the divergence angle of the light beams emitted from the light emitting component 121 along the slow axis direction Y and the fast axis direction X. Therefore, in a case where the laser 12 having the reflector 122B is applied to a laser projection apparatus such as a laser television, a laser projector, and the like, a design size of the light path assembly located at the light path of the laser assembly may be reduced, which is advantageous for achieving a miniaturized design of the laser projection apparatus.

Referring to FIG. 20, the light incident surface $f_3$ of the reflector 122B may contract the divergence angle of the light beams emitted from the light emitting component 121 in the slow axis direction Y from $\beta$ (usually 5° to 10°) to $\beta_1$. For example, $\beta_1$ is 0°, 1°, 2°, 3°, 4°, 5°, 10°, etc. It should be understood that the divergence angle $\beta_1$ after contraction is not limited herein.

The slow axis direction Y of the light beams emitted from the light emitting component 121 is parallel to the substrate 120 (that is, an angle between the slow axis direction Y and the substrate 120 is 0°), is perpendicular to the substrate 120 (that is, an angle between the slow axis direction Y and the substrate 120 is 90°), or is inclined at an angle range of (0°, 90°) with the substrate 120. Correspondingly, the fast axis direction X and the slow axis direction Y of the light beam emitted from the light emitting component 121 are perpendicular to each other. Therefore, the fast axis direction X of the light beam emitted from the light emitting component 121 is parallel to the substrate 120 (that is, an angle between the fast axis direction X and the substrate 120 is 0°), is perpendicular to the substrate 120 (that is, an angle between the fast axis direction X and the substrate 120 is) 90°, or is inclined at an angle range of (0°, 90°) with the substrate 120. Here, an angle range of (0°, 90°) may refer to an angle range between 0° and 90°, and an angle in the range may be an arbitrary one, such as 5°, 10°, 15°, 20°, 30°, 45°, 60°, 75°, 80° or 85°.

As shown in FIG. 14 to FIG. 21, the slow axis direction Y of the light beam emitted from the light emitting component 121 is parallel to the substrate 120, and the fast axis direction X of the light beam emitted from the light emitting component 121 is perpendicular to the substrate 120. In this way, since the maximum width of the light emitting opening 1211 of the light emitting component 121 in the fast axis direction is reduced, in a case where the light beams emitted from the light emitting component 121 are all irradiated onto the reflector 122B, a height of the light emitting component 121 protruding from the substrate 120 may be reduced, which is advantageous to reduce the height of the laser 12 in its light output direction. Further, a maximum heat generating surface of the light emitting component 121 is attached to the substrate 120, and heat generated during the illumination of the light emitting component 121 may be effectively dissipated.

In another implementation, the slow axis direction Y of the light beam emitted from the light emitting component 121 may be perpendicular to the substrate 120, and the fast axis direction X of the light beam emitted from the light emitting component 121 may be parallel to the substrate 120. In this way, it is possible to greatly reduce the height of the light emitting component 121 protruding from the substrate 120, which is advantageous to reduce the height of the laser 12 in its light output direction.

In some embodiments, as shown in FIGS. 14 to 17, FIG. 20 and FIG. 21, the fast axis direction X of the light beam is perpendicular to the substrate 120, and the slow axis direction Y of the light beam is parallel to the substrate 120; the intersections of the light incident surface $f_3$ of the reflector 122B and each plane perpendicular to the fast axis direction X are a concave arc. Angles between a tangent plane of the light incident surface $f_3$ of the reflector 122B at each point of the concave arc and the fast axis direction X are all equal, so that the light incident surface $f_3$ forms an aspheric surface. The light emitting opening 1211 of the light emitting component 121 is located on a line/connecting the corresponding center of each concave arc to achieve a center-to-center setting. In this way, light emitting directions of the light beams emitted from the light emitting component 121 along the slow axis direction Y are the same after reflected by the light incident surface $f_3$, and the divergent light emitted from the light emitting component 121 in the slow axis direction Y may be converted into parallel light, thereby achieving the purpose of collimating the light emitted from the light emitting component 121 along the slow axis direction Y.

Herein, for example, referring to FIG. 14, the radius $r_1$ of each concave arc is 2 mm-5 mm. For example, the radius $r_1$ of each concave arc may be 2 mm, 3 mm, 5 mm, etc., and is not specifically limited herein. Thus, a space between the reflector 122B and the light emitting component 121 is moderate, and the structural compactness of the laser 12 and the processing difficulty of the reflector 122B may be taken into consideration at the same time.

In some embodiments, as shown in FIG. 18, the fast axis direction X of the light beam is perpendicular to the substrate 120, and the slow axis direction Y of the light beam is parallel to the substrate 120; the intersections of the light incident surface $f_3$ of the reflector 122B and each plane perpendicular to the slow axis direction Y are a concave arc. Angles between the tangent plane of the light incident surface $f_3$ of the reflector 122B at each point of the concave arc and the slow axis direction Y are all equal, so that the light incident surface $f_3$ forms an aspheric surface. The light emitting opening 1211 of the light emitting component 121 is located on a line $l_1$ connecting the corresponding center of each concave arc to achieve the center-to-center setting. In this way, the light emitting directions of the light beams emitted from the light emitting component 121 along the fast axis direction X are the same after reflected by the light incident surface $f_3$, and the divergent light emitted from the light emitting component 121 along the fast axis direction X may be converted into parallel light, thereby achieving the purpose of collimating the light emitted from the light emitting component 121 along the fast axis direction X.

Herein, for example, referring to FIG. 18, the radius $r_2$ of each concave arc is 2 mm to 5 mm. For example, the radius $r_2$ of each concave arc may be 2 mm, 3 mm, 5 mm, etc., and is not specifically limited herein. Thus, the space between the reflector 122B and the light emitting component 121 is moderate, and the structural compactness of the laser 12 and the processing difficulty of the reflector 122B may be taken into consideration at the same time.

On this basis, for example, as shown in FIG. 16 and FIG. 20, the light emitting opening 1211 of the light emitting component 121 is disposed at the intersection of connection l and connection $l_1$. In this way, the light incident surface $f_3$ of the reflector 122B may simultaneously reflect and collimate light emitted from the light emitting component 121 in the fast axis direction X and the slow axis direction Y. Therefore, the laser 12 does not need to be provided with a separate collimating structure, and the divergent light emitted by the light emitting component 121 along the fast axis direction X and the slow axis direction Y may be collimated, thereby reducing the structural complexity of the laser projection apparatus and the cost of the laser projection apparatus.

Herein, it should be noted that, when the light incident surface $f_3$ of the reflector 122B may collimate light emitted from the light emitting component 121 in the fast axis direction X, it is not necessary to contract the divergence angle of the light emitted by the light emitting component 121 diverging in the fast axis direction X to 0°, but it may be considered that the light incident surface $f_3$ collimates the light emitted by the light emitting component 121 in the fast axis direction X when the light incident surface $f_3$ shrinks the divergence angle of the light emitted from the light emitting component 121 in the fast axis direction X to an angle value within the range of [0°, 5°]. Similarly, regarding the light incident surface $f_3$ of the reflector 122B may collimate the light emitted from the light emitting component 121 in the slow axis direction Y, it is not necessary to contract the divergence angle of the light emitted by the light emitting component 121 diverging in the slow axis direction Y to 0°, but it may be considered that the light incident surface $f_3$ collimates the light emitted by the light emitting component 121 in the slow axis direction Y when the light incident surface $f_3$ shrinks the divergence angle of the light emitted from the light emitting component 121 in the slow axis direction Y to an angle value within the range of [0°, 5°]. Here, a range of [0°, 5°] may refer to an angle range between 0° and 5°, inclusive. And an angle in the range may be an arbitrary one, such as 0°, 1°, 2°, 3°, 4° or 5°.

For example, the reflector 122B is a prism or a reflective lens.

Ways in which the light emitting component 121 is mounted on the substrate 120 are various. For example, the light emitting component 121 is directly mounted on the substrate 120; or, as shown in FIGS. 14 to 21, the light emitting component 121 is indirectly mounted on the substrate 120 by a structure (such as a heat sink 126, or the like), that is, the heat sink 126 is mounted on the substrate 120, and the light emitting component 121 is mounted on the heat sink 126. Herein, the heat sink has high thermal conductivity and may play a role in heat dissipation. For example, the heat sink may be a structure such as a metal block (such as copper block) and the like.

In a case where the light emitting component 121 is directly connected to the substrate 120, there are various connection manners. For example, the light emitting component 121 may be connected to the substrate 120 by screwing, clamping, bonding, welding or the like. In some examples, the light emitting component 121 is bonded to the substrate 120 by a thermal conductive adhesive. The thermal conductive adhesive has good thermal conductivity, and may effectively transfer heat generated by the light emitting component 121 to the substrate 120 during the operation of the light emitting component 121, and further diffuse the heat from the substrate 120 to outside environment. In some examples, the light emitting component 121 is welded on the substrate 120. The welding manner is a more firmly connecting manner, and the welding material is usually a metal material. The metal material has good thermal conductivity, and may effectively transfer heat generated by the light emitting component to the substrate 120 during the operation of the light emitting component 121, further diffusing the heat from the substrate 120 to external environment.

Similarly, the reflector 122B may be directly connected to the substrate 120 or may be indirectly connected to the substrate 120 by a structure such as a subplate, which is not specifically limited herein. In a case where the reflector 122B is directly connected to the substrate 120, there are various connection manners. For example, the reflector 122B may be connected to the substrate 120 by screwing, clamping, bonding, welding or the like, which is not specifically limited herein.

The substrate 120 serves to dissipate heat. The material of the substrate 120 may be copper, aluminum, iron, or the like, which is not specifically limited herein. In some embodiments, the material of the substrate 120 is copper or copper alloy. The copper or copper alloy has good heat dissipation effect, and may quickly dissipate heat generated during the operation of the light emitting component 121.

Figure 22:
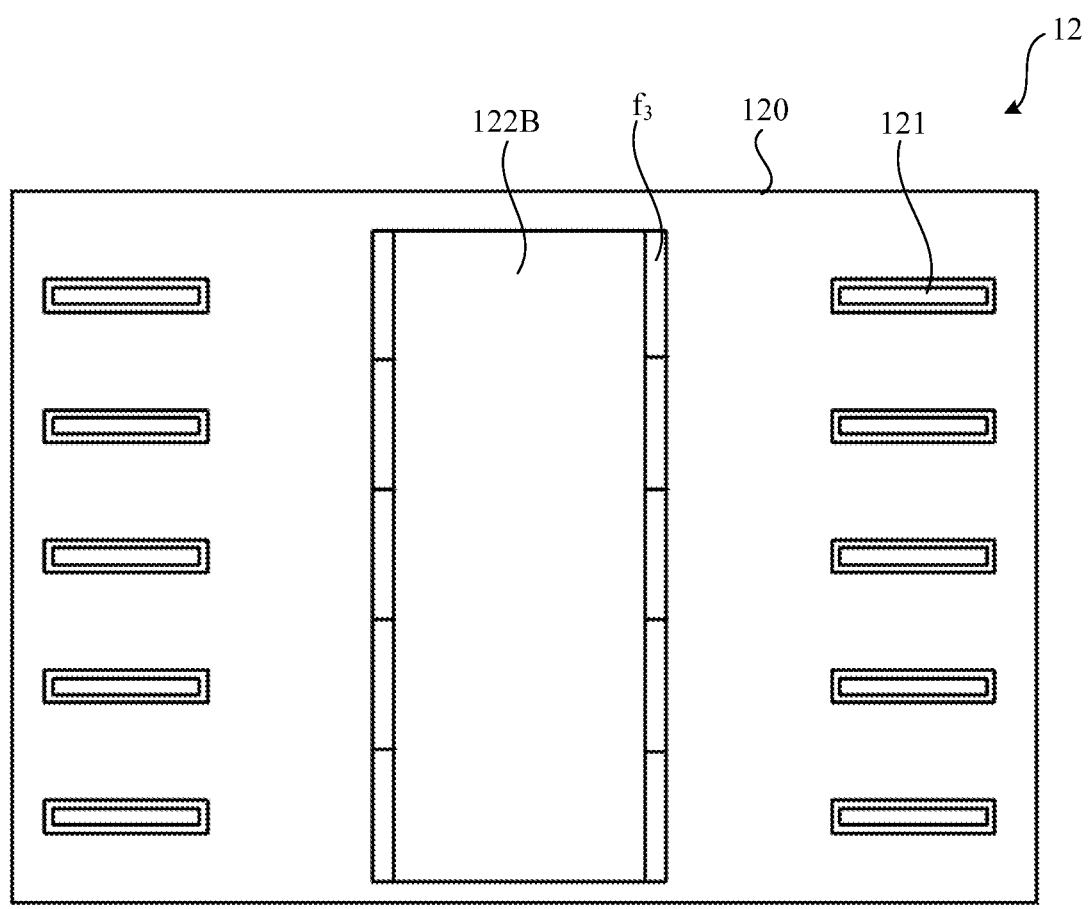
FIG. 22 is a top view of a single laser of the laser assembly shown in FIG. 13, where the light beams emitted from the light emitting component in the laser is substantially parallel to the plane in which the light emitting component is located.
Figure 23:
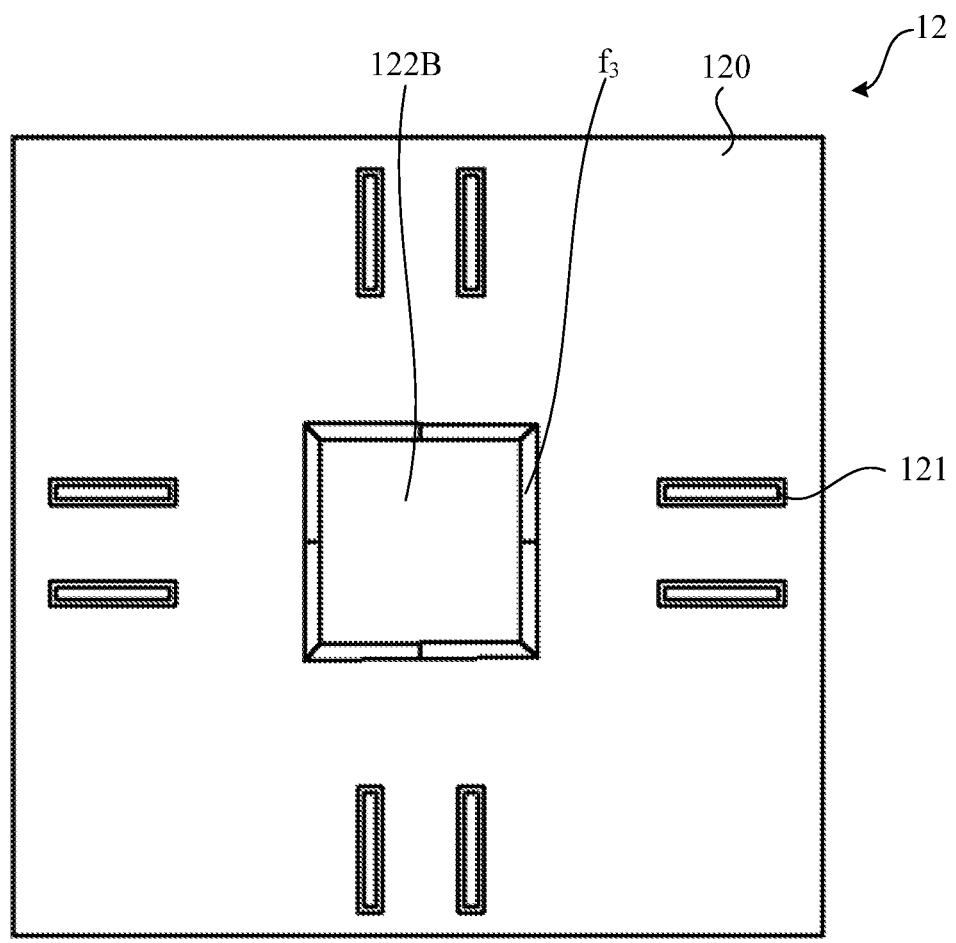
FIG. 23 is a top view of another single laser of the laser assembly shown in FIG. 13, where the light beams emitted from the light emitting component in the laser is substantially parallel to the plane in which the light emitting component is located.

In some embodiments, as shown in FIG. 22 and FIG. 23, each laser 12 includes at least one light emitting component 121, and the at least one light emitting component 121 is sequentially arranged along a circumferential direction of the reflector 122B. The reflector 122B includes at least one light incident surface $f_3$, and the at least one light incident surface $f_3$ is in a one-to-one correspondence with the at least one light emitting component 121. In this way, the brightness of the laser 12 may be increased by disposing a plurality of light emitting components 121.

For example, the number of the light emitting components 121 may be 6, 8, 10, etc., which is not specifically limited herein, and may be specifically set according to the requirement of the brightness of the laser 12. In addition, arrangement positions of the light emitting components 121 are not particularly limited. For example, as shown in FIG. 22, a plurality of light emitting components 121 are arranged around two opposite side edges of the reflector 122B. For another example, as shown in FIG. 23, a plurality of light emitting components 121 are arranged around four sides of the reflector 122B.

The light emitting component 121 may be any one of a red light emitting component, a blue light emitting component, or a green light emitting component. In some embodiments, a light emitting component with one color is disposed corresponding to each of light incident surfaces of the reflector 122B. For example, as shown in FIG. 22, a blue light emitting component is disposed at the left side of the reflector 122B, and a red light emitting component is disposed at the right side of the reflector 122B. For another example, as shown in FIG. 23, a blue light emitting component is disposed at the upper side and the left side of the reflector 122B, a red light emitting component is disposed at the bottom side of the reflector 122B, and a green light emitting component is disposed at the right side of the reflector 122B.

For example, there is a gap between two adjacent light emitting components 121. For example, the space between two adjacent light emitting components 121 is 1 mm to 10 mm. In this way, it may avoid the interference between light beams emitted from two adjacent light emitting components 121.

Figure 24:
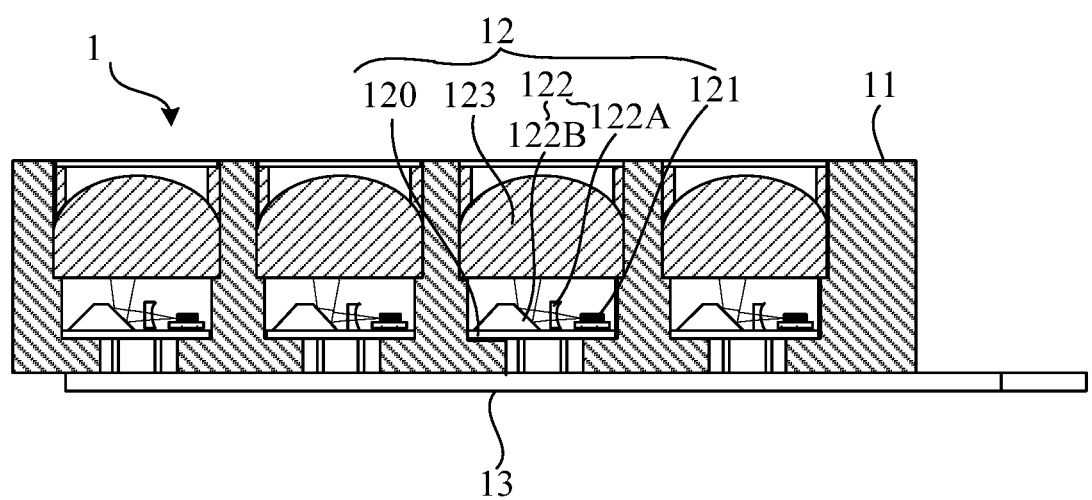
FIG. 24 is a schematic structural diagram of yet another laser assembly according to some embodiments of the present disclosure, where the light beams emitted from the light emitting component in the laser assembly is substantially parallel to the plane in which the light emitting component is located.

In another embodiment, as shown in FIG. 24, the beam-shaping component 122 includes a beam-shaping lens 122A and a reflector 122B. The beam-shaping lens 122A is disposed on the substrate 120 and located at the light path of the light emitting component 121, and the surface of the beam-shaping lens 122A close to the light emitting component 121 is a light incident surface. The light incident surface is configured to transmit light beams emitted from the light emitting component 121 to make the light beams emit toward the reflector 122B, and the light incident surface is configured to change a divergence angle of the light beam along at least one of the fast axis direction and the slow axis direction of the light beam. The reflector 122B is disposed on the substrate 120 and located at a side of the beam-shaping lens 122A away from the light emitting component 121, and the reflector 122B is configured to reflect light beams transmitted by the beam-shaping lens 122A to make the light beam emit in a direction away from the substrate 120. In addition, the laser assembly 1 further includes a collimating lens 123 for collimating the light beams reflected by the reflector 122B.

In one implementation, the reflector 122B in the laser assembly shown in FIG. 13 may be regarded as an integral structure of the reflector 122B and the beam-shaping lens 122A in the laser assembly shown in FIG. 24. Compared with the laser 12 shown in FIG. 24, the laser 12 shown in FIG. 13 saves the use of optical components, and the structure thereof is more compact, which is advantageous for achieving a miniaturized design. The laser 12 shown in FIG. 24 saves the use of optical elements, and the structure thereof is more compact, which is advantageous for achieving a miniaturized design.

Figure 25:
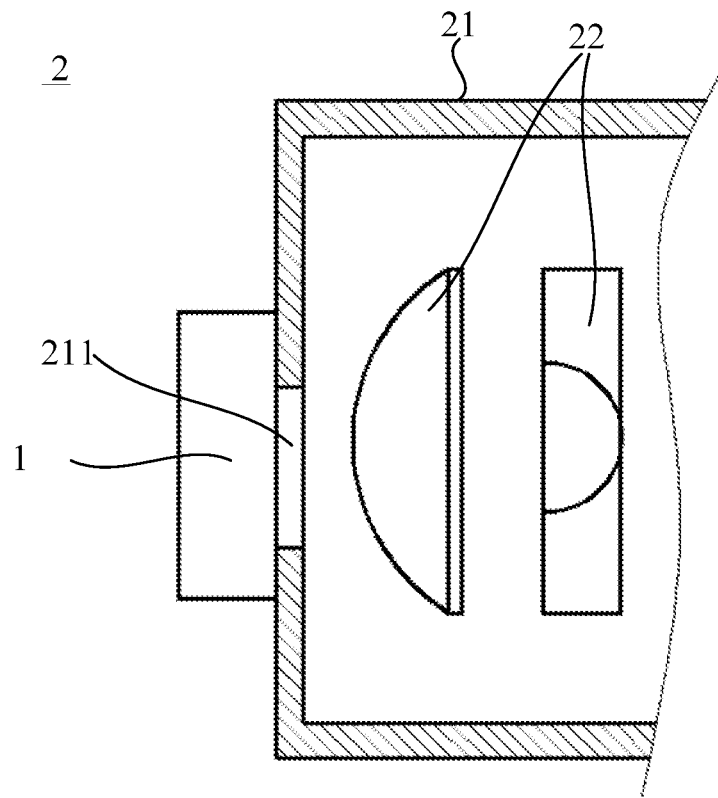
FIG. 25 is a schematic structural diagram of a laser source according to some embodiments of the present disclosure.

Some embodiments of the present disclosure provide a laser source 2. As shown in FIG. 25, the laser source 2 includes any one of the above described laser assembly 1, the main housing 21, and the light path assembly 22. The main housing 21 is located at the light path of the laser assembly 1, and the main housing 21 is fixedly connected to the laser assembly 1. The light path assembly 22 is disposed in the main housing 21, and the main housing 21 is provided with a light incident port 211. The light incident port 211 is located at the light emitting path of the laser assembly 1.

Since the laser source 2 includes any one of the above described laser assembly 1, the laser source 2 provided by some embodiments of the present disclosure may solve the same or similar technical problem and achieve the same or similar expected effect as any of the above described laser assembly 1.

Figure 26:
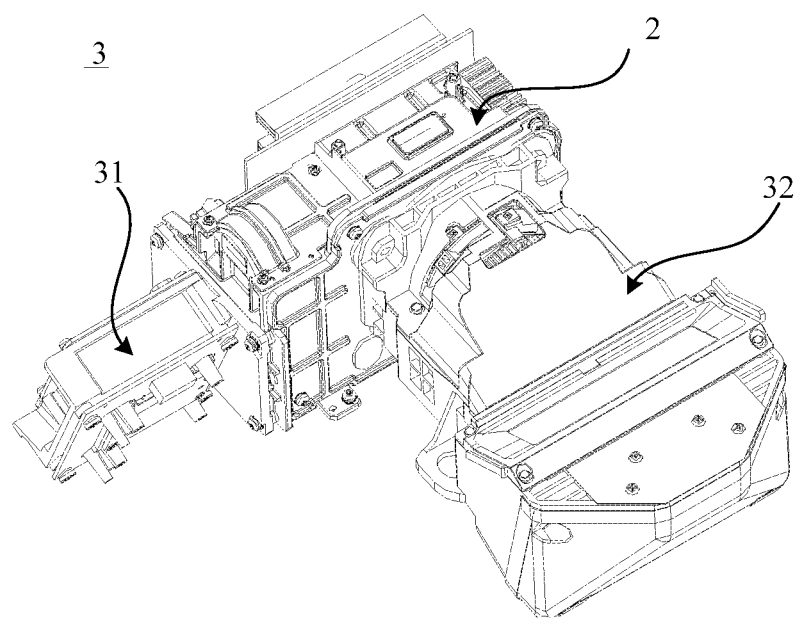
FIG. 26 is a schematic structural diagram of a laser projection apparatus according to some embodiments of the present disclosure.

Some embodiments of the present disclosure provide a laser projection apparatus 3, as shown in FIG. 26, including the above described laser source 2, an optical machine 31 and a projection lens 32 that are sequentially connected. The optical machine 31 is configured to modulate illumination light beams emitted from the laser source 2 to generate image light beams, and project the image light beams to the projection lens 32. The projection lens 32 is used to project or form an image with the image light beams.

Since the laser projection apparatus 3 includes the above described laser source 2, the laser projection apparatus 3 provided by some embodiments of the present disclosure may solve the same technical problems and achieve the same expected effects as the laser source 2 described in the above embodiments.

Figure 27:
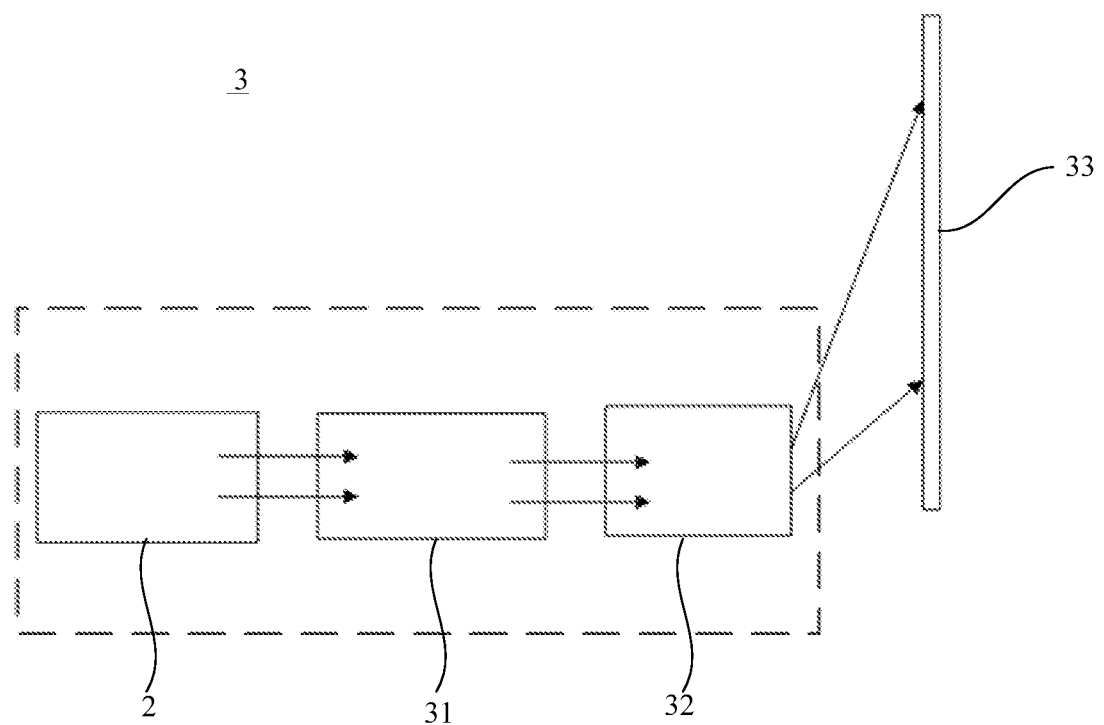
FIG. 27 is a schematic diagram showing an equivalent structure of another laser projection apparatus according to some embodiments of the present disclosure.

In some embodiments, as shown in FIG. 27, the laser projection apparatus 3 further includes a projection screen 33 disposed at the light emitting path of the projection lens 32, and projected light beams imaged by the projection lens 32 form a projection picture on the projection screen 33.

In the description of the instructions, specific features, structures, materials or characteristics may be combined in any suitable manner in any one or more embodiments or examples.

The foregoing descriptions are merely some specific implementation manners of the present disclosure, but the protection scope of the present disclosure is not limited thereto, and the changes or replacements that any person skilled in the art may easily think of in the technical scope disclosed by the present disclosure should be within the protection scope of the present disclosure. Therefore, the protection scope of the present disclosure shall be determined by the protection scope of the claims.

What is claimed is:

1. A laser assembly comprising:
   a support comprising at least one mounting groove, each of the at least one mounting groove comprising an opening; and
   at least one laser mounted in the at least one mounting groove in a one-to-one correspondence, each of the at least one laser comprising:
   a light emitting component configured to emit a light beam,
   a beam-shaping component disposed at a light path of the light emitting component, the beam-shaping component comprising a light incident surface,
   wherein the light incident surface of the beam-shaping component is disposed close to the light emitting component, the light incident surface is configured to transmit the light beam emitted from the light emitting component toward the opening of the mounting groove, and the light incident surface is configured to change a divergence angle of the light beam along at least one of a fast axis direction or a slow axis direction of the light beam;
a light collimating lens disposed at a side of the beam-shaping lens away from the light emitting component; and
the light collimating lens comprising a light emitting surface, wherein the light emitting surface of the light collimating lens configured to collimate the light beam that is adjusted by the beam-shaping lens.

2. The laser assembly according to claim 1, wherein:
the beam-shaping component includes a beam-shaping lens;
a light incident surface of the beam-shaping lens is configured to transmit the light beam emitted from the light emitting component; and
the light incident surface of the beam-shaping lens is configured to perform at least one of:
reducing a divergence angle of the light beam along the fast axis direction to reduce a width of the light beam in the fast axis direction, or
increasing a divergence angle of the light beam along the slow axis direction to increase a width of the light beam in the slow axis direction.

3. The laser assembly according to claim 2, wherein:
an intersection between the light incident surface of the beam-shaping lens and a plane perpendicular to the slow axis direction is a straight line or a convex curve to reduce the divergence angle of the light beam along the fast axis direction; and/or
an intersection of the light incident surface of the beam-shaping lens and a plane perpendicular to the fast axis direction is a concave curve to increase the divergence angle of the light beam along the slow axis direction.

4. The laser assembly according to claim 2, wherein a refractive index of the beam-shaping lens is a range between 1.5 and 1.9, inclusive.

5. The laser assembly according to claim 1, wherein:
a light emitting surface of the beam-shaping lens is in contact with a light incident surface of the light collimating lens, and the beam-shaping lens and the light collimating lens comprises a same material; or
the beam-shaping lens and the light collimating lens are of an integral structure.

6. The laser assembly according to claim 1, further comprising:
a circuit board connected to the support; and
wherein the light emitting component in each laser electrically connects to the circuit board.

7. The laser assembly according to claim 1, wherein:
the beam-shaping component comprises a reflector;
the reflector comprises a light incident surface, the light incident surface of the reflector is configured to reflect the light beam emitted from the light emitting component; and
the light incident surface of the reflector is configured to perform at least one of:
reducing a divergence angle of the light beam along the fast axis direction to reduce a width of the light beam in the fast axis direction, or
reducing a divergence angle of the light beam along the slow axis direction to reduce a width of the light beam in the slow axis direction.

8. The laser assembly according to claim 7, wherein:
the light incident surface of the reflector is a concave surface; and
an intersection of the light incident surface and a plane perpendicular to at least one of the fast axis direction and the slow axis direction is a concave curve.

9. The laser assembly according to claim 7, wherein:
the light incident surface of the reflector is a concave surface;
an intersection of the light incident surface of the reflector and a plane perpendicular to the fast axis direction is a concave curve; and
an intersection of the light incident surface of the reflector and a plane perpendicular to the slow axis direction is a concave curve.

10. The laser assembly according to claim 7, wherein:
each of the at least one laser further comprises a substrate, and the light emitting component comprises a light emitting opening;
the slow axis direction of the light beam is parallel to the substrate and the fast axis direction of the light beam is perpendicular to the substrate; and
an intersection of the light incident surface of the reflector and a plane perpendicular to the fast axis direction is a concave arc, an angle between a tangent plane of the light incident surface of the reflector at each point of the concave arc and the fast axis direction is equal, and the light emitting opening of the light emitting component is located on a line connecting a corresponding center of each concave arc, to enable the light incident surface of the reflector to reflect and collimate the light emitted from the light emitting component in the slow axis direction.

11. The laser assembly according to claim 10, wherein a radius $r_1$ of each concave arc is within a range between 2 mm and 5 mm, inclusive.

12. The laser assembly according to claim 7, wherein:
each of the at least one laser further comprises a substrate, and the light emitting component comprises a light emitting opening;
the slow axis direction of the light beam is parallel to the substrate and the fast axis direction of the light beam is perpendicular to the substrate; and
an intersection of the light incident surface of the reflector and a plane perpendicular to the slow axis direction is a concave arc, an angle between a tangent plane of the light incident surface of the reflector at each point of the concave arc and the slow axis direction is equal, and the light emitting opening of the light emitting component is located on a line connecting a corresponding center of each concave arc, to enable the light incident surface of the reflector to reflect and collimate the light emitted from the light emitting component in the fast axis direction.

13. The laser assembly according to claim 7, wherein the reflector comprises at least one of a prism or a reflective lens.

14. The laser assembly according to claim 7, wherein:
each laser includes at least one light emitting component, and the at least one light emitting component is sequentially arranged around the reflector; and
the reflector comprises at least one light incident surface in a one-to-one correspondence with the at least one light emitting component.

15. The laser assembly according to claim 14, wherein a gap is disposed between two adjacent light emitting components.

16. The laser assembly according to claim 1, wherein:
the beam-shaping component comprises a reflector and a beam-shaping lens;

the beam-shaping lens is disposed at a light path of the
light emitting component, the beam-shaping lens comprises a light incident surface disposed close to the light emitting component, and the light incident surface is configured to transmit the light beam emitted from the light emitting component toward the reflector; and the reflector is disposed at a side of the beam-shaping lens away from the light emitting component, and the reflector is configured to reflect the light beam transmitted by the beam-shaping lens toward the opening of the mounting groove.

17. The laser assembly according to claim 1, wherein:
each laser further comprises a substrate, and the light emitting component is disposed on the substrate; and
the light emitting component comprises
a light emitting chip.

18. A laser source comprising:
the laser assembly according to claim 1;
a main housing disposed at a light path of the laser assembly and fixedly connected to the laser assembly, the main housing comprising a light incident port, and the light incident port disposed at a light emitting path of the laser assembly; and
a light path assembly disposed in the main housing.

19. A laser projection apparatus comprising:
a laser source according to claim 18;
an optical machine disposed at a light path of the light beam emitted from the laser source and configured to modulate the light beam emitted from the laser source to generate an image light beam and emit the image light beam; and
a projection lens disposed at the light path of the light beam emitted from the laser source and configured to receive the image light beam and generate an image based on the image light beam.

20. A laser assembly comprising:
a support comprising at least one mounting groove, each of the at least one mounting groove comprising an opening; and
at least one laser mounted in the at least one mounting groove in a one-to-one correspondence, each of the at least one laser comprising:
a light emitting component configured to emit a light beam,
a beam-shaping component disposed at a light path of the light emitting component, the beam-shaping component comprising a light incident surface,
wherein the light incident surface of the beam-shaping component is disposed close to the light emitting component, the light incident surface is configured to transmit the light beam emitted from the light emitting component toward the opening of the mounting groove, and the light incident surface is configured to change a divergence angle of the light beam along at least one of a fast axis direction or a slow axis direction of the light beam, and
wherein the beam-shaping component comprises a reflector,
the reflector comprises a light incident surface, the light incident surface of the reflector is configured to reflect the light beam emitted from the light emitting component, and
the light incident surface of the reflector is configured to perform at least one of:
reducing a divergence angle of the light beam along the fast axis direction to reduce a width of the light beam in the fast axis direction, or
reducing a divergence angle of the light beam along the slow axis direction to reduce a width of the light beam in the slow axis direction.

\* \* \* \* \*